(12) United States Patent
Koo et al.

(10) Patent No.: US 6,937,027 B2
(45) Date of Patent: Aug. 30, 2005

(54) HYBRID TYPE SENSOR FOR DETECTING HIGH FREQUENCY PARTIAL DISCHARGE

(75) Inventors: Ja Yoon Koo, Seoul (KR); Jee Hong Kim, Kyungki-do (KR)

(73) Assignee: Hanyang Hak Won Co., Ltd. (KR)

( * ) Notice: Subject to any disclaimer, the term of this patent is extended or adjusted under 35 U.S.C. 154(b) by 0 days.

(21) Appl. No.: 10/682,369

(22) Filed: Oct. 9, 2003

(65) Prior Publication Data

US 2004/0130328 A1 Jul. 8, 2004

(30) Foreign Application Priority Data

Oct. 10, 2002 (KR) ................................. 10-2002-0061712
Sep. 18, 2003 (KR) ................................. 10-2003-0064846

(51) Int. Cl.[7] ........................... H01H 9/50; H01H 31/12
(52) U.S. Cl. ...................................... 324/536; 324/551
(58) Field of Search ............................. 324/536, 512, 324/500, 509, 510, 522, 541, 544–547, 532, 535, 551, 552, 772, 76.11, 115; 361/42, 78, 87

(56) References Cited

U.S. PATENT DOCUMENTS

| | | | | |
|---|---|---|---|---|
| 5,247,258 A | * | 9/1993 | Tripier et al. | ................. 324/536 |
| 5,469,067 A | | 11/1995 | Endoh et al. | |
| 5,496,984 A | * | 3/1996 | Goto et al. | ............... 219/69.18 |
| 5,903,158 A | | 5/1999 | Eriksson et al. | |
| 6,114,871 A | * | 9/2000 | Shiota et al. | ................. 324/772 |
| 6,172,862 B1 | * | 1/2001 | Jonnatti et al. | ................ 361/78 |
| 6,285,538 B1 | * | 9/2001 | Krahn | ........................... 361/87 |
| 6,297,642 B1 | | 10/2001 | Shibahara et al. | |
| 6,313,640 B1 | | 11/2001 | Nasrallah et al. | |
| 6,420,879 B2 | | 7/2002 | Cooke | |
| 6,639,769 B2 | * | 10/2003 | Neiger et al. | .................. 361/42 |

FOREIGN PATENT DOCUMENTS

| | | |
|---|---|---|
| DE | 199 32 611 A1 | 1/2001 |
| EP | 0 491 554 B1 | 5/1996 |
| JP | 05-107301 A | 4/1993 |

OTHER PUBLICATIONS

Philippow, Eugen, "*Grundlagen der Elektrotechnik*", 10. Auflage, Chapter 6.12, pp. 666–667, pub. Verlag Technik Berlin (2000) (German language).

Jee–Hong, Kim and Ja–Yoon, Koo; "An Investigation of the Applicablity of the Hybrid Sensor for Detecting High Frequency Partial Discharge"; JICABLE '03—6th International Conference on Insulated Power Cables, Information Programme Registration, Jun. 20–26, 2003, Paris–Versailles, France; 7 pgs.*

* cited by examiner

*Primary Examiner*—Anjan Deb
*Assistant Examiner*—Hoai-An D. Nguyen
(74) *Attorney, Agent, or Firm*—The Webb Law Firm, P.C.

(57) ABSTRACT

Disclosed herein is a hybrid type sensor for detecting high frequency partial discharge which can detect high frequency partial discharge at a high signal-to-noise ratio without being influenced by power noise and surrounding noise, and guarantee the safety of a test when breakdown occurs. The sensor forms two or three signal paths with different impedances wherein a low frequency power signal is bypassed to ground through a first path, and a high frequency partial discharge current is allowed to flow through a second path and is detected as a resistance component through a resistor. Further, a surge voltage input to the sensor due to breakdown is input to the ground through a third path.

24 Claims, 35 Drawing Sheets

1nC

HYBRID TYPE SENSOR FOR DETECTING HIGH FREQUENCY PARTIAL DISCHARGE

BACKGROUND OF THE INVENTION

1. Field of the Invention

The present invention relates, in general, to a sensor for detecting the amount of partial discharge required to inspect insulated conditions of power devices and, more particularly, to a hybrid type sensor for detecting high frequency partial discharge, which is not influenced by power noise and surrounding noise, and is capable of safely detecting the amounts of high frequency partial discharge ranging from a few mV to several hundred mV at a high signal-to-noise ratio even though a high surge voltage is input to the sensor due to breakdown.

2. Description of the Related Art

Generally, an inspection for insulated conditions of power equipment is performed by analyzing partial discharge radiated from the power equipment. However, since the level of a partial discharge signal is as low as a few mV to several hundred mV, external noise may be easily input to the power equipment. Therefore, there have progressed researches for High Frequency Partial Discharge (HFPD), which improves a Signal-to-Noise (S/N) ratio by measuring partial discharge in a high frequency band in which external noise is not easily input.

A HFPD detecting scheme defined in IEC 270 is implemented so that a small amount of partial discharge current generated in an inspection object is guided to a coupling capacitor by using the coupling capacitor and the partial discharge current is measured at a terminal connected to a ground side. In this case, the capacitance of the coupling capacitor is prescribed to be two times or more the capacitance of the inspection object. However, in many cases, the capacitance of the inspection object is actually greater than that of the coupling capacitor. Therefore, the HFPD detecting scheme is problematic in that it is difficult to measure a partial discharge current due to the limitation of the capacitance of the coupling capacitor, and, additionally, a large-sized inspecting device and many investment costs are required.

Various sensors for measuring the HFPD, such as inductive, capacitive or resistive sensors, or sensors used for antennas, have been proposed according to their uses. The HFPD measuring sensors are constructed so that they take signals obtained from the sensors, signals picked up by the antennas for surrounding noise, or the propagating direction of the signals into consideration, analyze partial discharge patterns by a computer, and then extract only a partial discharge signal from the analyzed results.

There are two types of HFPD measuring sensors most generally used in the prior art: a Current Transformer (CT) type sensor and a shunt type sensor.

The CT type sensor, which is a non-contact type sensor, shows a high S/N ratio in a specific frequency band because it uses a resonance point fc, but oscillation occurs to decrease sensitivity.

The shunt type sensor has the most ideal precision, but it is disadvantageous in that, when breakdown occurs, a high surge voltage may be induced at an input terminal of the sensor to damage a test system and power noise may be input to the sensor. Further, theoretically, the shunt type sensor detects partial discharge with respect to the frequencies of all bands. However, actually, self-resonance occurs at higher frequencies due to stray capacitance or inductance caused by a lead wire, so that impedance is increased at higher frequencies. Therefore, it is difficult to measure partial discharge in high frequency bands. Moreover, as shunt resistance is increased, a power frequency is further increased, thus decreasing a S/N ratio. Therefore, in the case of the conventional shunt type sensor, there are required the selection of a suitable shunt resistance and measures for the input of power noise.

As described above, since the conventional high frequency partial discharge detecting sensors have many problems, it is difficult to apply the sensors to actual inspection fields.

SUMMARY OF THE INVENTION

Accordingly, the present invention has been made keeping in mind the above problems occurring in the prior art. The present invention overcomes these problems by providing a hybrid type sensor for detecting high frequency partial discharge, which is not influenced by power noise and surrounding noise, and is capable of safely detecting the amounts of high frequency partial discharge ranging from a few mV to several hundred mV at a high signal-to-noise ratio even though a high surge voltage is input to the sensor due to breakdown.

The present invention further provides a hybrid type sensor for detecting high frequency partial discharge of a power device, comprising a first measurement terminal electrically connected to a measurement point of a power device, which is an inspection object, to receive a power signal to be inspected; a second measurement terminal connected to ground to output the power signal to be inspected; a first impedance forming unit disposed between the first and second measurement terminals and implemented to have a low impedance including an inductive reactance component, thus forming a first path that allows a low frequency signal to pass therethrough; a second impedance forming unit disposed between the first and second measurement terminals, connected in parallel with the first impedance forming unit and implemented to have a high impedance including a capacitive reactance component, thus forming a second path that allows a high frequency partial discharge current to pass therethrough; a detecting unit connected in series between the second impedance forming unit and the second measurement terminal to convert an amount of the high frequency partial discharge current passing through the second path into measurement signals having a predetermined shape; and first and second output terminals for outputting positive and negative measurement signals having a predetermined shape detected by the detecting unit, respectively.

In the hybrid type sensor, the first impedance forming unit may be implemented as an inductor with a predetermined inductance having both ends connected to the first and second measurement terminals.

In the hybrid type sensor, the second impedance forming unit may be implemented as a ceramic capacitor without a lead wire.

In the hybrid type sensor, the detecting unit may be implemented as a chip resistor without a lead wire, the chip resistor being disposed between the second impedance forming unit and the second measurement terminal.

The hybrid type sensor may further comprise a dummy inductor disposed between the first and second impedance forming units and the second measurement terminal, thus reducing ground noise.

In the hybrid type sensor, the ceramic capacitor may have a withstanding voltage of 10 kV or higher.

Further, the present invention provides a hybrid type sensor for detecting high frequency partial discharge of a power device, comprising a first measurement terminal electrically connected to a measurement point of a power device, which is an inspection object, to receive a power signal to be inspected; a second measurement terminal connected to ground to output the power signal to be inspected; a first impedance forming unit disposed between the first and second measurement terminals and implemented to have a low impedance including an inductive reactance component, thus forming a first path that allows a low frequency signal to pass therethrough; a second impedance forming unit disposed between the first and second measurement terminals, connected in parallel with the first impedance forming unit and implemented to have a high impedance including a capacitive reactance component, thus forming a second path that allows a high frequency partial discharge current to pass therethrough; a detecting unit connected in series between the second impedance forming unit and the second measurement terminal to convert an amount of the high frequency partial discharge current passing through the second path into measurement signals having a predetermined shape; first and second output terminals for outputting positive and negative measurement signals having a predetermined shape detected by the detecting unit, respectively; and a third impedance forming unit disposed between the first and second terminals, connected in parallel with the first and second impedance forming units and implemented to have a high impedance including a capacitive reactance, thus forming a third path that allows a ultra high frequency signal, such as a surge current, to pass therethrough.

In the hybrid type sensor, the first impedance forming unit may be implemented as an inductor with a predetermined inductance having both ends connected to the first and second measurement terminals.

In the hybrid type sensor, the second impedance forming unit may be implemented as a ceramic capacitor without a lead wire.

In the hybrid type sensor, the detecting unit may be implemented as a chip resistor without a lead wire, the chip resistor being disposed between the second impedance forming unit and the second measurement terminal.

The hybrid type sensor may further comprise a dummy inductor disposed between the first and second impedance forming units and the second measurement terminal, thus reducing ground noise.

In the hybrid type sensor, the ceramic capacitor may have a withstanding voltage of 10 kV or higher.

Further, the present invention provides a method of detecting an amount of partial discharge using the sensor for detecting high frequency partial discharge, comprising the steps of connecting the high frequency partial discharge detecting sensor between an inspection object and ground; and obtaining the amount of discharge x from an output voltage y output from a detecting unit of the high frequency partial discharge detecting sensor using the following equation $$y = 3.4877x + 3.0437.$$

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
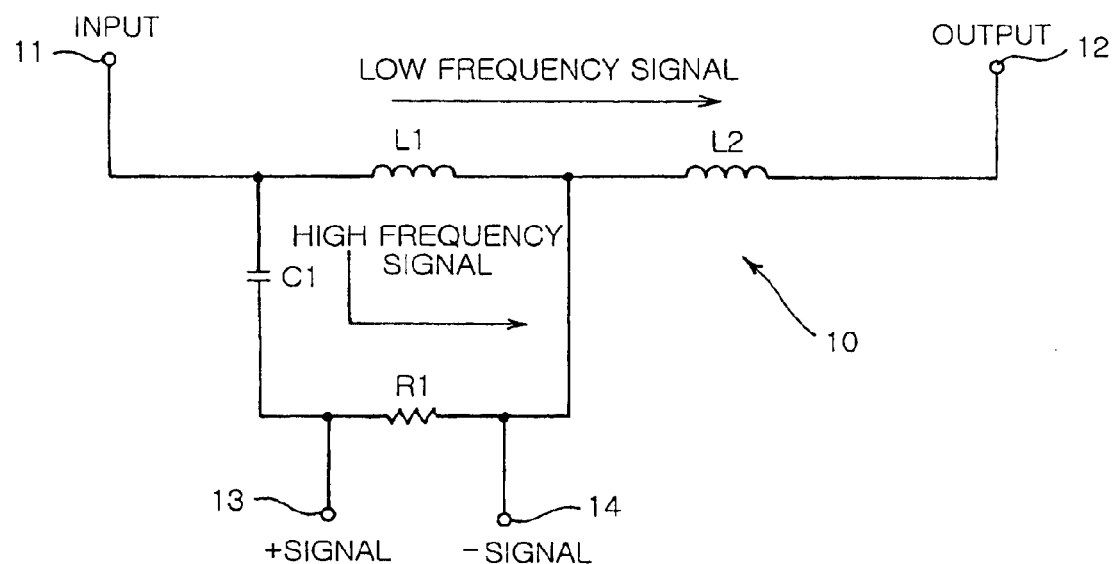
FIG. 1 is a circuit diagram of a hybrid type sensor for detecting high frequency partial discharge according to a first embodiment of the present invention.

Hereinafter, the construction and operation of a hybrid type sensor for detecting high frequency partial discharge according to embodiments of the present invention will be described in detail with reference to the attached drawings.

Reference now should be made to the drawings, in which the same reference numerals are used throughout the different drawings to designate the same or similar components.

FIG. 1 is a circuit diagram of a hybrid type sensor for detecting high frequency partial discharge according to a first embodiment of the present invention. As shown in FIG. 1, a sensor 10 includes a first measurement terminal 11 connected to a power device, which is an inspection object, to receive power signals, a second measurement terminal 12 connected to ground, a first inductor L1 disposed between the first and second measurement terminals 11 and 12 so as to allow a low frequency power signal of the power signals, input to the first measurement terminal 11, to flow to the second measurement terminal 12, a capacitor C1 disposed between the first and second measurement terminals 11 and 12 so as to allow a high frequency fine partial discharge signal of the power signals, input to the first measurement terminal 11, to pass through the capacitor C1, a resistor R1 connected in series to the capacitor C1 to determine a resonance point by the coupling of the capacitor C1 and the first inductor L1, a second inductor L2 for dummy use disposed between both the first inductor L1 and the resistor R1 and the second measurement terminal 12 so as to prevent the input of ground noise to the sensor, and first and second output terminals 13 and 14 for outputting a voltage corresponding to the magnitude of a high frequency partial discharge current flowing through both ends of the resistor R1.

Figure 2:
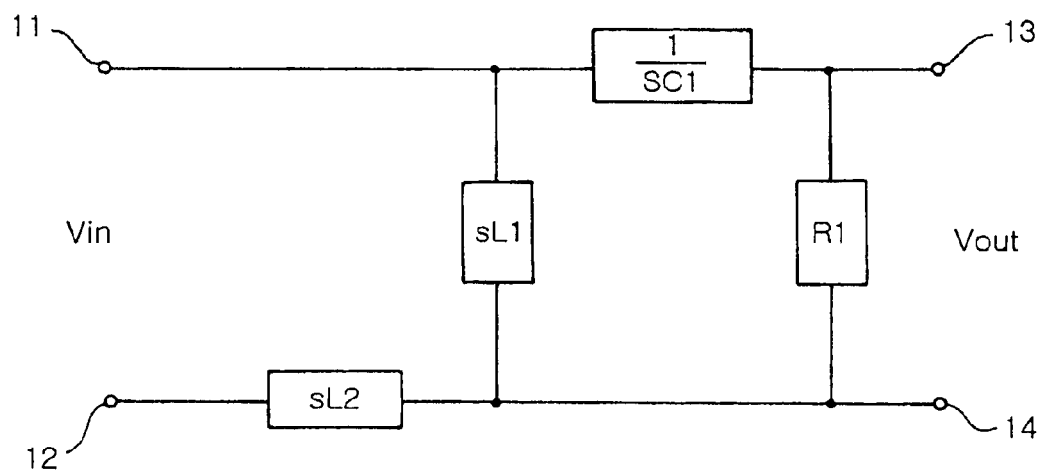
FIG. 2 is an equivalent circuit diagram of the sensor of FIG. 1.

FIG. 2 is an equivalent circuit diagram of the sensor of FIG. 1. Referring to FIG. 2, Vin is an input voltage induced at the first and second measurement terminals 11 and 12, sL1 and sL2 are impedances of the first and second inductors L1 and L2, respectively, 1/sC1 is a capacitance of the capacitor C1, and R1 is an impedance of the resistor R1.

The sensor of the present invention having the above construction forms two signal paths for low frequency power noise signals and high frequency partial discharge signals using a difference between impedances, thus reducing undesirable influences due to power noise at the time of measuring high frequency partial discharge.

Figure 3:
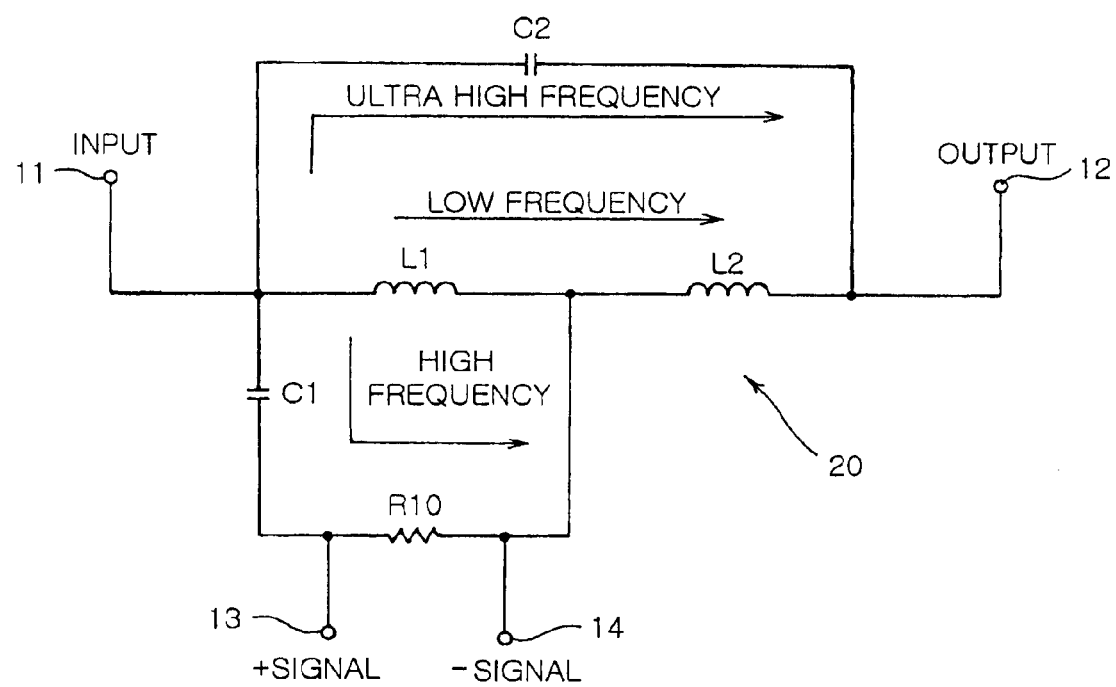
FIG. 3 is a circuit diagram of a hybrid type sensor for detecting high frequency partial discharge according to a second embodiment of the present invention.

Next, FIG. 3 is a circuit diagram of a hybrid type high frequency partial discharge detecting sensor according to a second embodiment of the present invention. As shown in FIG. 3, a sensor 20 includes a first measurement terminal 11 connected to a power device, which is an inspection object, to receive power signals, a second measurement terminal 12 connected to ground, a first inductor L1 disposed between the first and second measurement terminals 11 and 12 so as to allow a low frequency power signal of the power signals, input to the first measurement terminal 11, to flow to the second measurement terminal 12, a first capacitor C1 disposed between the first and second measurement terminals 11 and 12 so as to allow a high frequency fine partial discharge signal of the power signals, input to the first measurement terminal 11, to pass through the first capacitor C1, a resistor R1 connected in series to the first capacitor C1 to determine a resonance point by the coupling of the first capacitor C1 and the first inductor L1, a second inductor L2 for dummy use disposed between both the first inductor L1 and the resistor R1 and the second measurement terminal 12 so as to prevent the input of ground noise to the sensor, first and second output terminals 13 and 14 for outputting a voltage corresponding to the magnitude of a high frequency partial discharge current flowing through both ends of the resistor R1, and a second capacitor C2 disposed between the first and second measurement terminals 11 and 12 and connected in parallel with the first capacitor C1 and the first and second inductors L1 and L2 so as to allow an ultra high frequency surge voltage to pass through the second capacitor C2.

The sensor according to the second embodiment shown in FIG. 3 further forms a third signal path in the above-described sensor according to the first embodiment. The third signal path is implemented to allow a surge voltage, which may be input to the sensor due to breakdown, to pass therethrough using a difference between impedances.

Figure 4A:
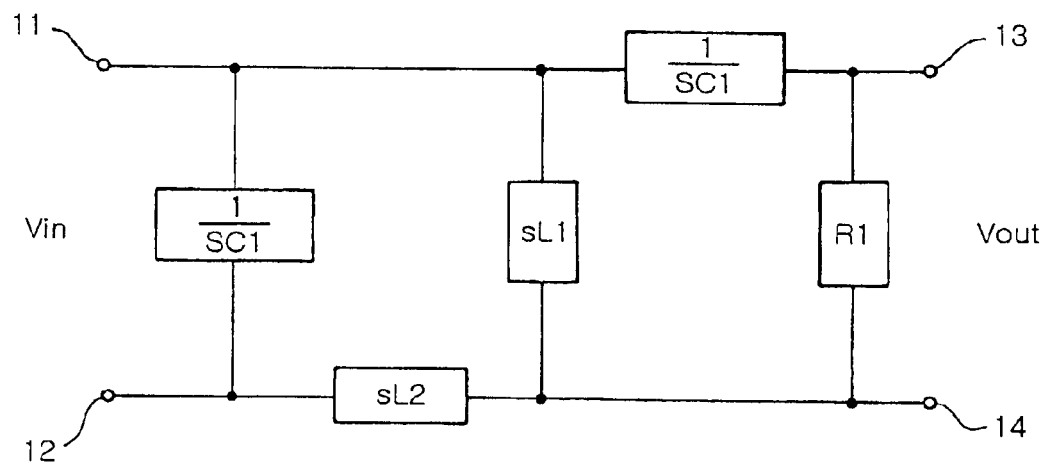
FIGS. 4a and 4b are equivalent circuit diagrams of the sensor of FIG. 3.
Figure 4B:
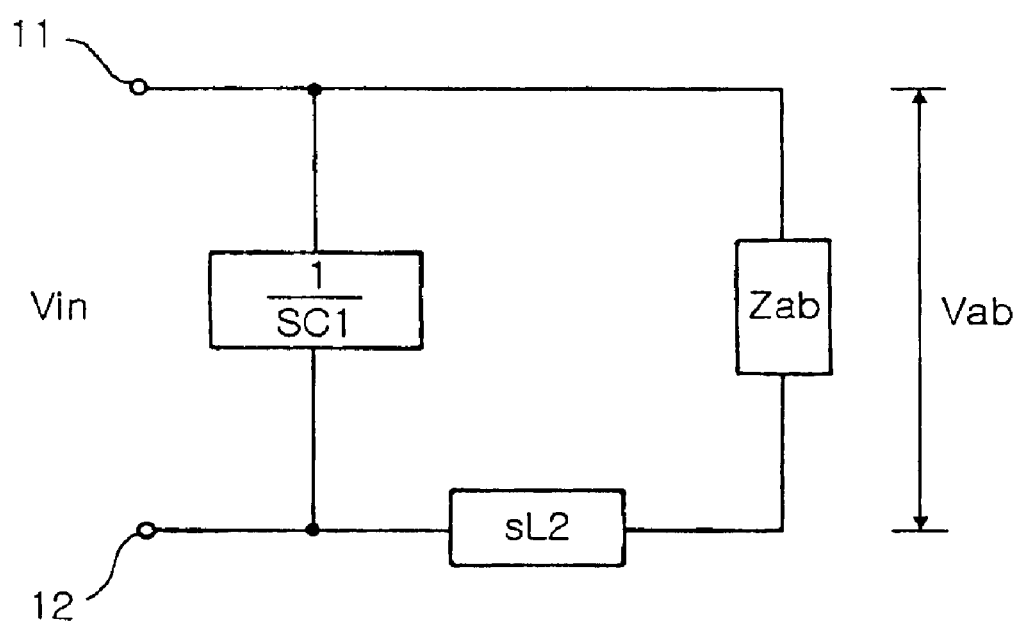

FIG. 4a is an equivalent circuit diagram of the sensor 20 of FIG. 3. Similar to FIG. 2, Vin is an input voltage induced at the first and second measurement terminals 11 and 12, sL1 and sL2 are impedances of the first and second inductors L1 and L2, respectively, 1/sC1 is a impedance of the first capacitor C1, R1 is an impedance of the resistor R1, and 1/sC2 is an impedance of the second capacitor C2. Further, FIG. 4b is an equivalent circuit diagram in which the circuit of FIG. 3 is further simplified. In FIG. 4b, Zab represents an impedance obtained by the first inductor L1, the first capacitor C1 and the resistor R1.

In FIGS. 1 to 4a and 4b, means designated by the same reference numerals have the same functions. Hereinafter, the operation of the circuit is described.

Figure 5A:
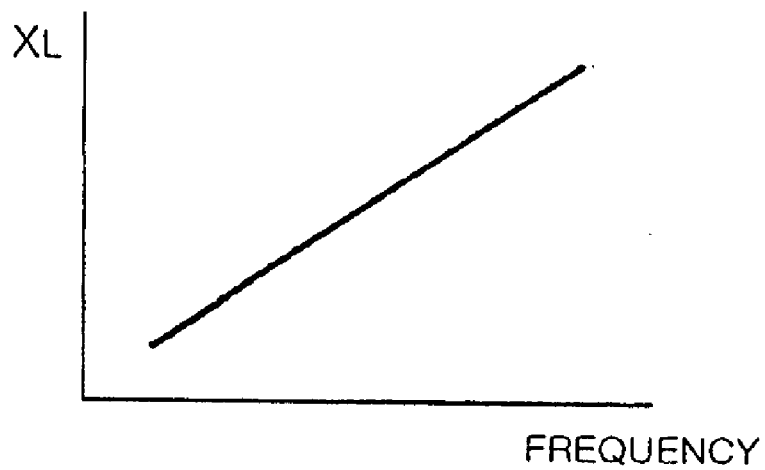
FIGS. 5a to 5c are graphs showing inductive reactance versus frequency characteristics, capacitive reactance versus frequency characteristics, and impedance versus frequency characteristics, respectively.

In the above construction, the first inductor L1 forms a low impedance due to an inductive reactance, and then forms a signal path for a low frequency power signal (60 Hz). In this case, the inductive reactance $X_L$ is $X_L = 2\pi fL$ (where f is a frequency of the signal, and L is an inductance value), and varies in proportion to the frequency, as shown in FIG. 5a. Therefore, a low impedance is formed with respect to a low frequency signal, so that the low frequency signal can pass through the first inductor L1. On the contrary, a high impedance is formed with respect to a high frequency signal, so that the high frequency signal is prevented from passing through the first inductor L1.

Next, the capacitor C1, which is a component for forming a high impedance, forms a signal path for a high frequency partial discharge current. Generally, a capacitive reactance $X_C$ is $$X_C = \frac{1}{2\pi fC}$$

Figure 5B:
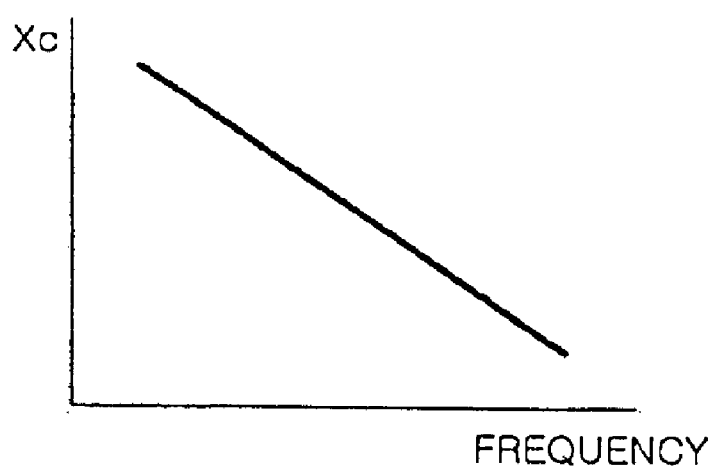

(where f is a frequency, and C is a capacitance value of the capacitor C1), and varies in inverse proportion to the frequency, as shown in FIG. 5b. Therefore, the impedance of the capacitor increases with respect to a low frequency, and decreases with respect to a high frequency. Therefore, a low frequency power signal or noise is blocked by the capacitor C1, and only a high frequency partial discharge current passes through the capacitor C1. A voltage corresponding to the magnitude of the current is generated at both ends of the resistor R1 and is then output as a high frequency partial discharge detection signal through the first and second output terminals 13 and 14 connected to both ends of the resistor R1.

In this case, it is preferable to implement the capacitor C1 as a ceramic capacitor with a withstanding voltage of 10 kV or higher so as to prevent a high current from flowing into the sensor when an accident occurs, and to form a high impedance so as to minimize a current flowing into a measuring stage of the sensor.

Generally, a resistor represents a constant impedance regardless of a frequency. However, as shown in FIG. 5c, the resistor determines a resonance point and a Q factor in an RLC circuit in which the first inductor L1, the capacitor C1 and the resistor R1 are coupled with each other in FIG. 1.

Further, in the construction, the resistor has a specific impedance due to a parasitic component of a lead wire thereof in a high frequency band, so that a chip type resistor without a lead wire is used so as to eliminate the specific impedance due to the parasitic component.

Figure 5C:
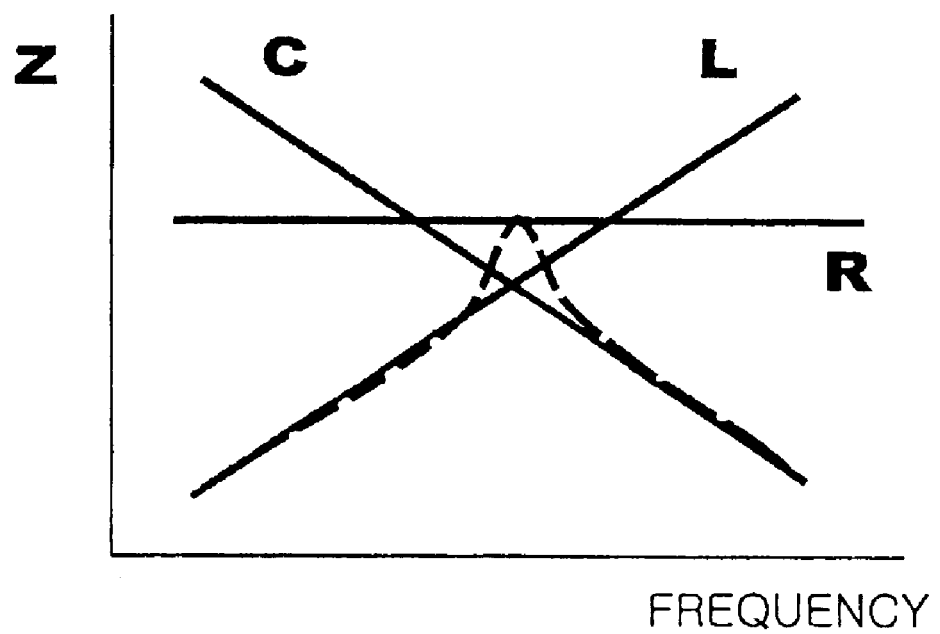

As shown in the graph of FIG. 5c, resonance occurs at an intersecting point of the impedance-frequency characteristic curves of the resistor R, the inductor L and the capacitor C. Therefore, the sensitivity for the high frequency partial discharge signal in the resonance frequency band is further increased.

Figure 5D:
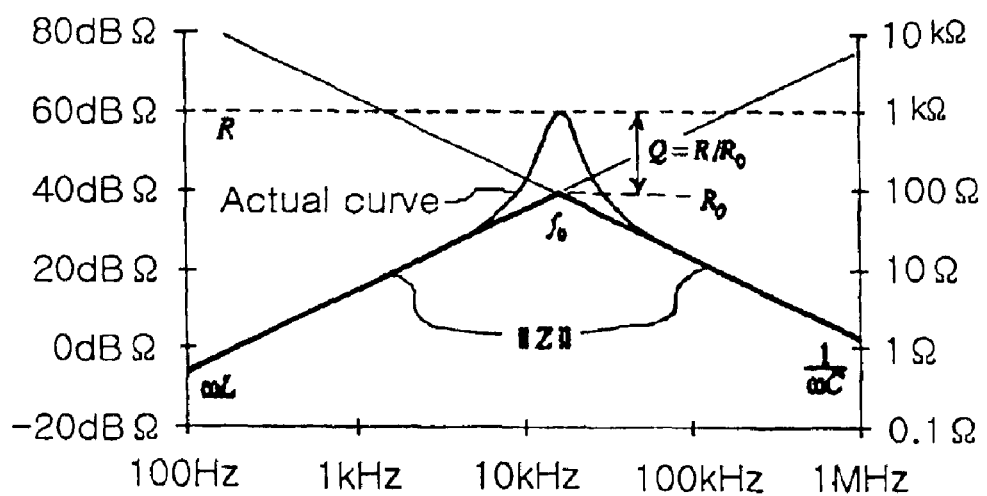
FIG. 5d is a Bode plot of actual impedance.

FIG. 5d is a bode plot of actual impedance. If the resistance value of the resistor R1 is greater than that of $f_o$, resonance corresponding to $Q=R/R_0$ occurs, while if the resistance value thereof is less than that of $f_o$, a value of Q drops by $R/R_0$.

Therefore, in the hybrid type partial discharge detecting sensor 10 of FIG. 1, noise components of low frequencies including a power frequency are input to the ground along a low frequency path passing through the first inductor L1, and a high frequency partial discharge signal is input to the sensor through the capacitor C1 and is measured at both ends of the resistor R1.

Further, the second inductor L2, used to prevent ground noise from being input to the sensor, functions as a dummy inductance of the measurement terminals. Further, when an accident occurs, the second inductor L2 allows a high current to flow through a low frequency path formed by the first and second inductors L1 and L2, thus minimizing an influence on a measuring device.

The hybrid type partial discharge detecting sensor can prevent the input of power noise of 60 Hz, which is a problem of the shunt type sensor, increase sensitivity over a frequency band to be measured, and improve a S/N ratio when measuring the partial discharge.

In this case, it should be noted that, when the above-described circuit is constructed, a total impedance and a shunt value to be measured must be matched.

Next, the characteristics of the sensor of the present invention are described with reference to the equivalent circuits of FIG. 2 and FIGS. 4a and 4b.

In FIG. 4b, the impedance Zab of the RLC resonance circuit unit is defined in Equation [1].

$$Zab = \frac{1}{sL1} + \frac{1}{\left(R1 + \frac{1}{sC1}\right)} = \frac{sL1 \cdot \left(R + \frac{1}{sC1}\right)}{sL1 + \left(R + \frac{1}{sC1}\right)} \quad [1]$$

$$= \frac{s^2L1C1R1 + sL1}{s^2L1C1 + sC1R1 + 1}$$

Further, a voltage Vab induced at the RLC resonance circuit unit is defined in Equation [2].

$$Vab = Vin - V_{L2} = \frac{Zab}{sL2 + Zab} \cdot Vin \quad [2]$$

$$= \frac{\frac{s^2L1C1R1 + sL1}{s^2L1C1 + sC1R1 + 1}}{sL2 + \frac{s^2L1C1R1 + sL1}{s^2L1C1 + sC1R1 + 1}} \cdot Vin$$

$$= \frac{s^2L1C1R1 + sL1}{s^3L1L2C1 + s^2(L1C1R1 + L1C1R1 + L2C1R1) + s(L1 + L2)} \cdot Vin$$

Further, an output voltage Vout, which is induced at both ends of the resistor R1, is defined in Equation [3].

$$Vout = \frac{R}{\frac{1}{sC1} + R} \cdot Vab \quad [3]$$

On the basis of the above Equations [2] and [3], a transfer function Vout/Vin of the sensor 20 of the present invention is obtained as expressed in Equation [4].

$$Vout/vin = \frac{(C1R1^2)s^3 + R1s^3}{(L2C1R1)s^4 + (L2 + C1R1^2 + \frac{L2}{L1}C1R1^2)s^3 + 2R1(1 + \frac{L2}{L1})s^2 + (\frac{1}{C1} + \frac{L2}{L1C1})} \quad [4]$$

The transfer function expressed in Equation [4] is equally applied to both the sensor 10 of FIG. 1 and the sensor of FIG. 2.

Through the above Equations, the values of the elements constituting the sensor are suitably set. For example, if maximum sensitivity is obtained in a frequency band of approximately $10^7$ [rad/sec], the inductance of the first inductor L1 is set to 1.677 mH, the inductance of the second inductor L2 is set to 29.9 μH, the capacitance of the first capacitor C1 is set to 514 pF, the capacitance of the second capacitor C2 is set to 300 pF, and the resistance of the resistor R1 is set to 2 kΩ.

Figure 6:
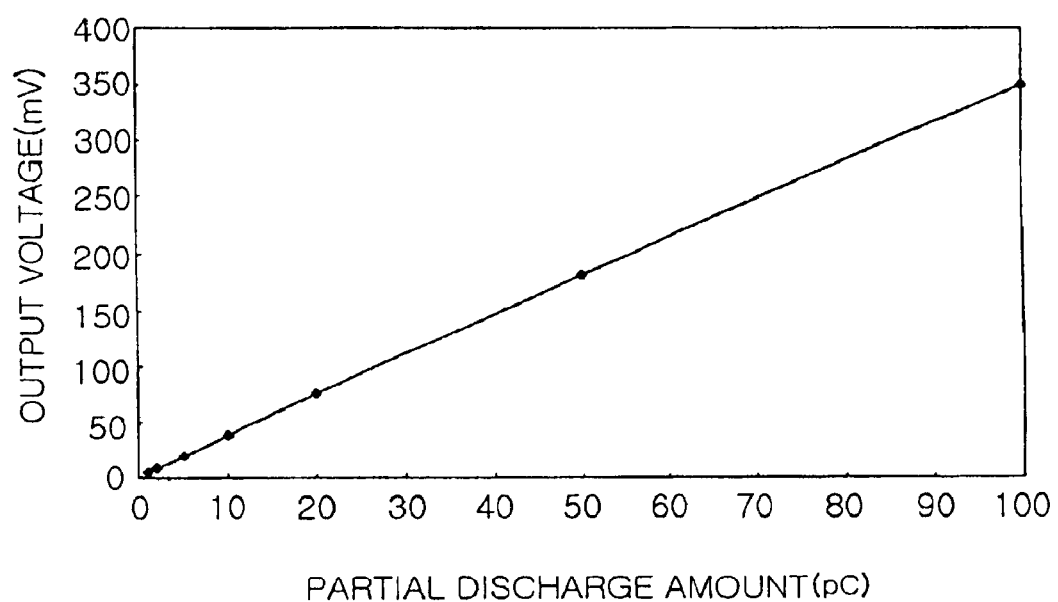
FIG. 6 is a graph showing output voltage versus the amount of discharge of the hybrid type partial discharge detecting sensor of the present invention.

FIG. 6 is a graph showing a relationship between the output voltage and the amount of discharge of the hybrid type partial discharge detecting sensor of the present invention through the measurement performed by a Partial Discharge (PD) calibrator. In this case, the amount of discharge is sequentially increased to 1, 2, 5, 10, 20, 50 and 100 pC, data on the response characteristics of the hybrid type partial discharge detecting sensor according to the increased amount of discharge are accumulated 128 times in an envelope mode, and then an average of peak-to-peak values of the data is obtained.

A trend line equation for the data shown in FIG. 6 is expressed in Equation [5], $$y=3.4877x+3.0437$$

$$R1^2=0.9997 \quad [5]$$

where y is a voltage output to the first and second output terminals 13 and 14 of the sensor of the present invention, and x is the measured amount of discharge. Therefore, the output voltage of the sensor of the present invention is applied to Equation [5], thus calculating the amount of high frequency partial discharge.

Figure 7:
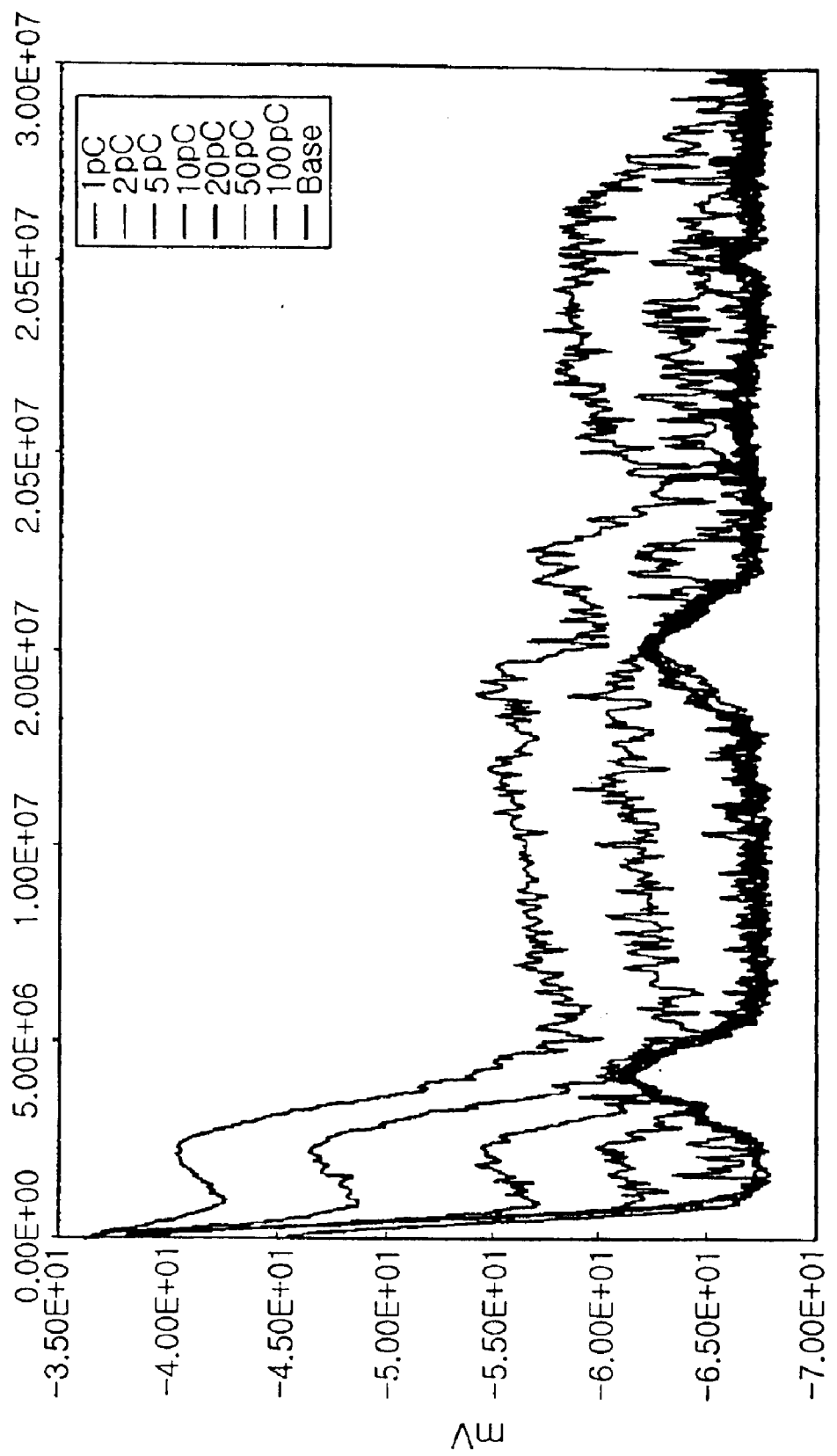
FIG. 7 is a graph showing output voltage versus frequency characteristics according to the amounts of discharge of the hybrid type partial discharge detecting sensor of the present invention.

Next, FIG. 7 is a graph showing the spectra of the signals output to the first and second output terminals 13 and 14 when the measurement of FIG. 6 is performed, according to a frequency and the amount of discharge. In FIG. 7, the sensitivity equal to or less than 2 pC can be obtained with respect to the signals in a 1 to 3 MHz frequency band.

Figure 8A:
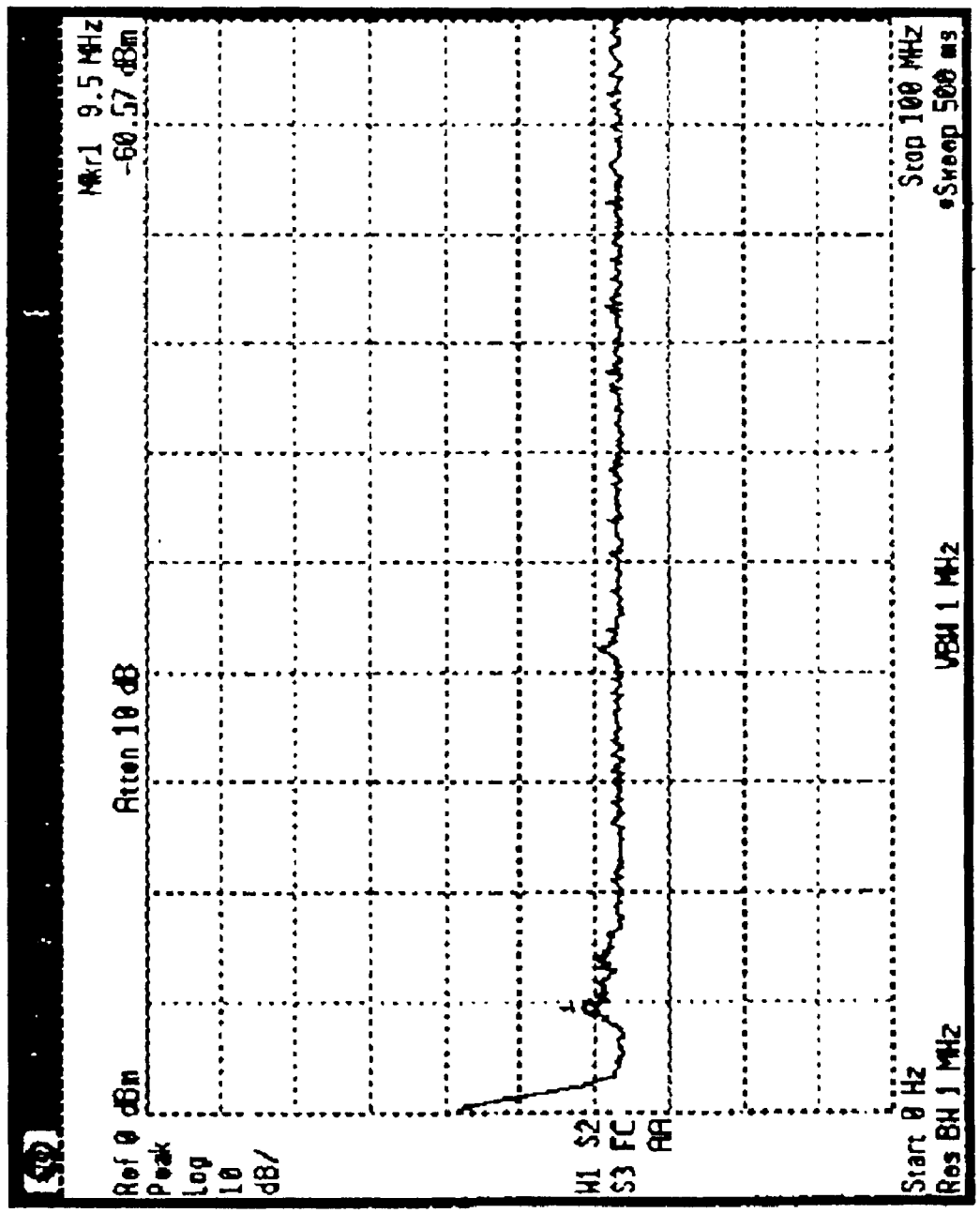
FIGS. 8a and 8b are graphs showing background noise and corona discharge in oil, respectively, measured by the sensor of the present invention.
Figure 8B:
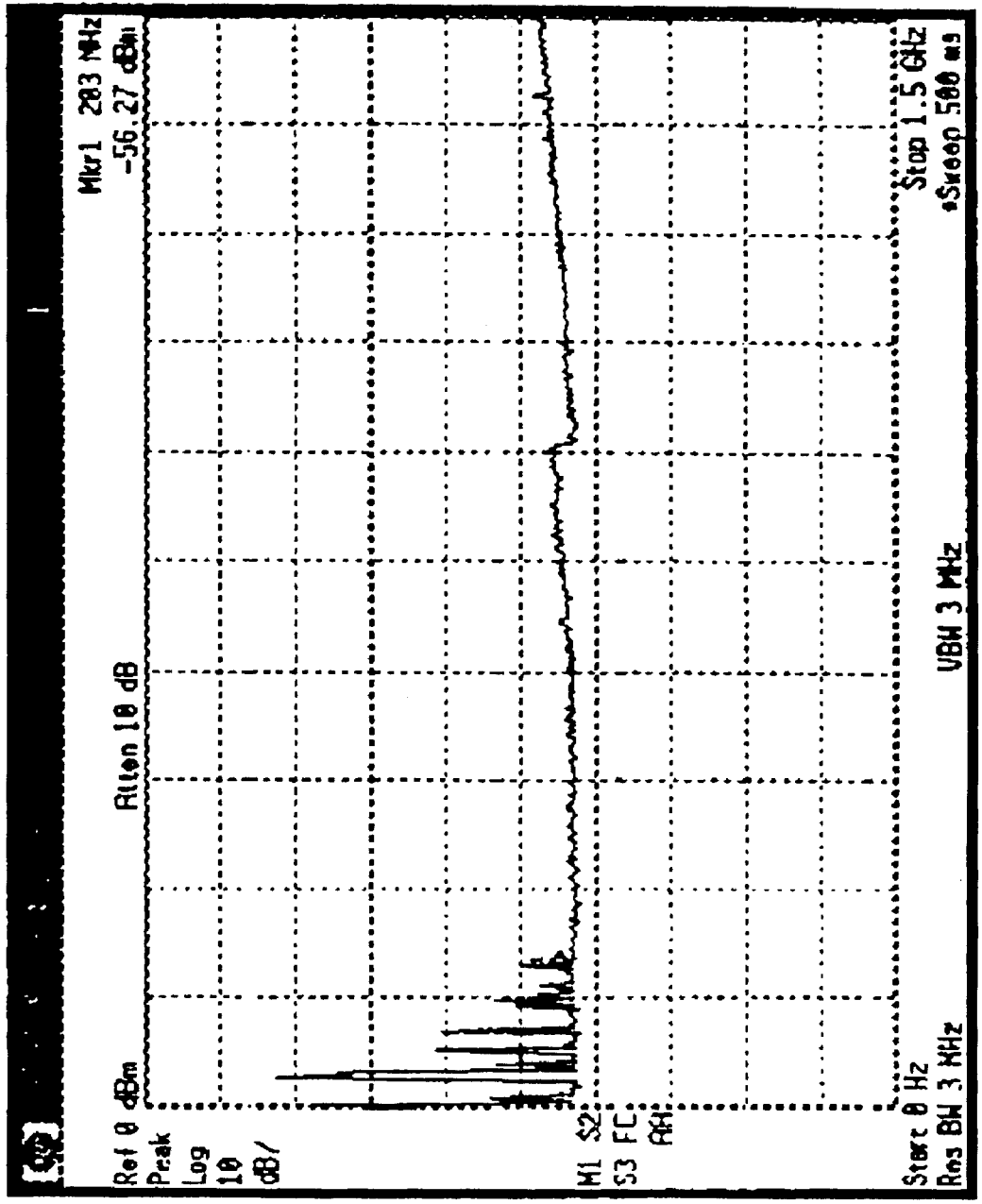
Figure 9A:
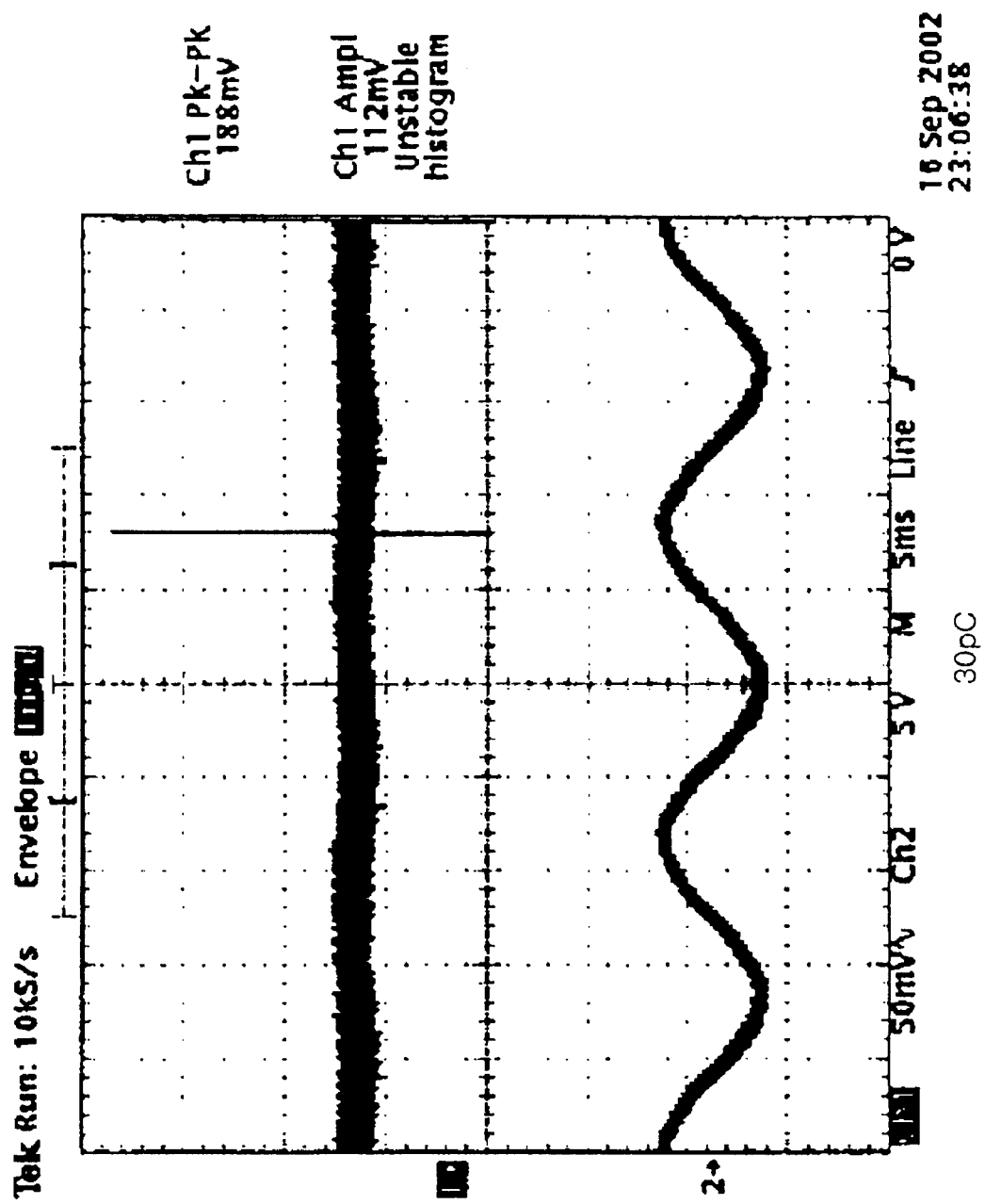
FIGS. 9a to 9f are views showing the screens of an oscilloscope on which response characteristics according to the amounts of discharge of the sensor of the present invention are displayed.
Figure 9B:
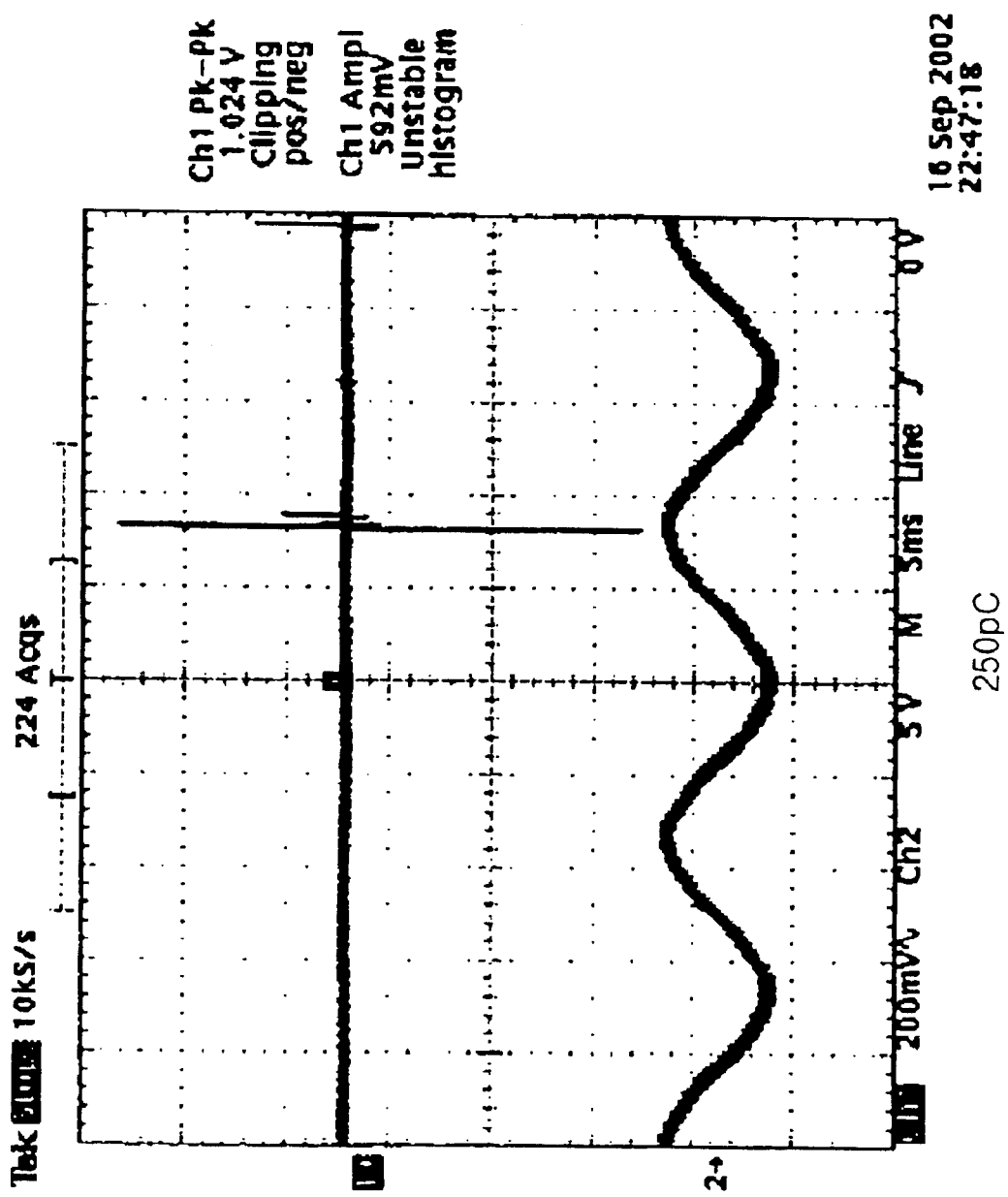
Figure 9C:
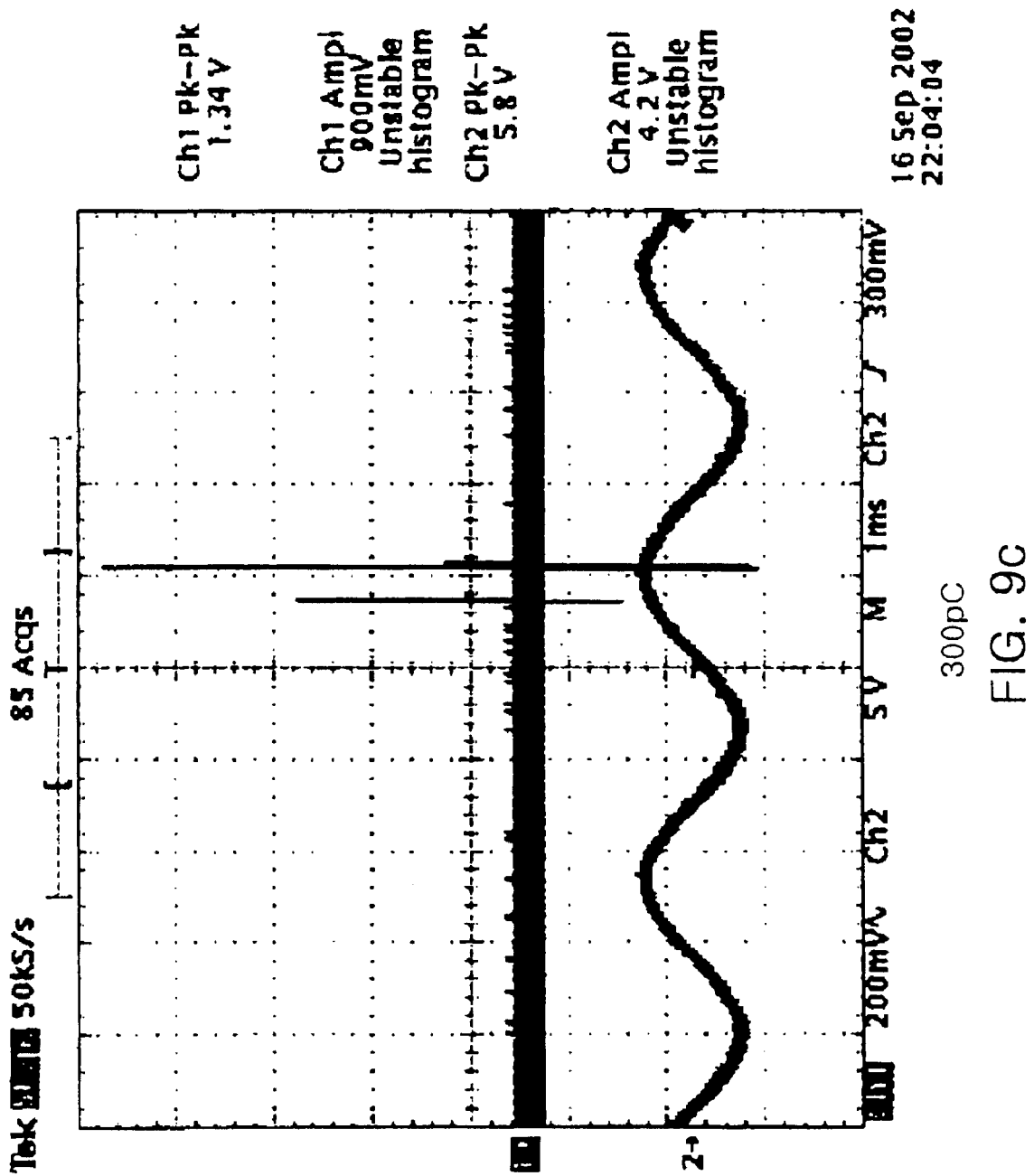
Figure 9D:
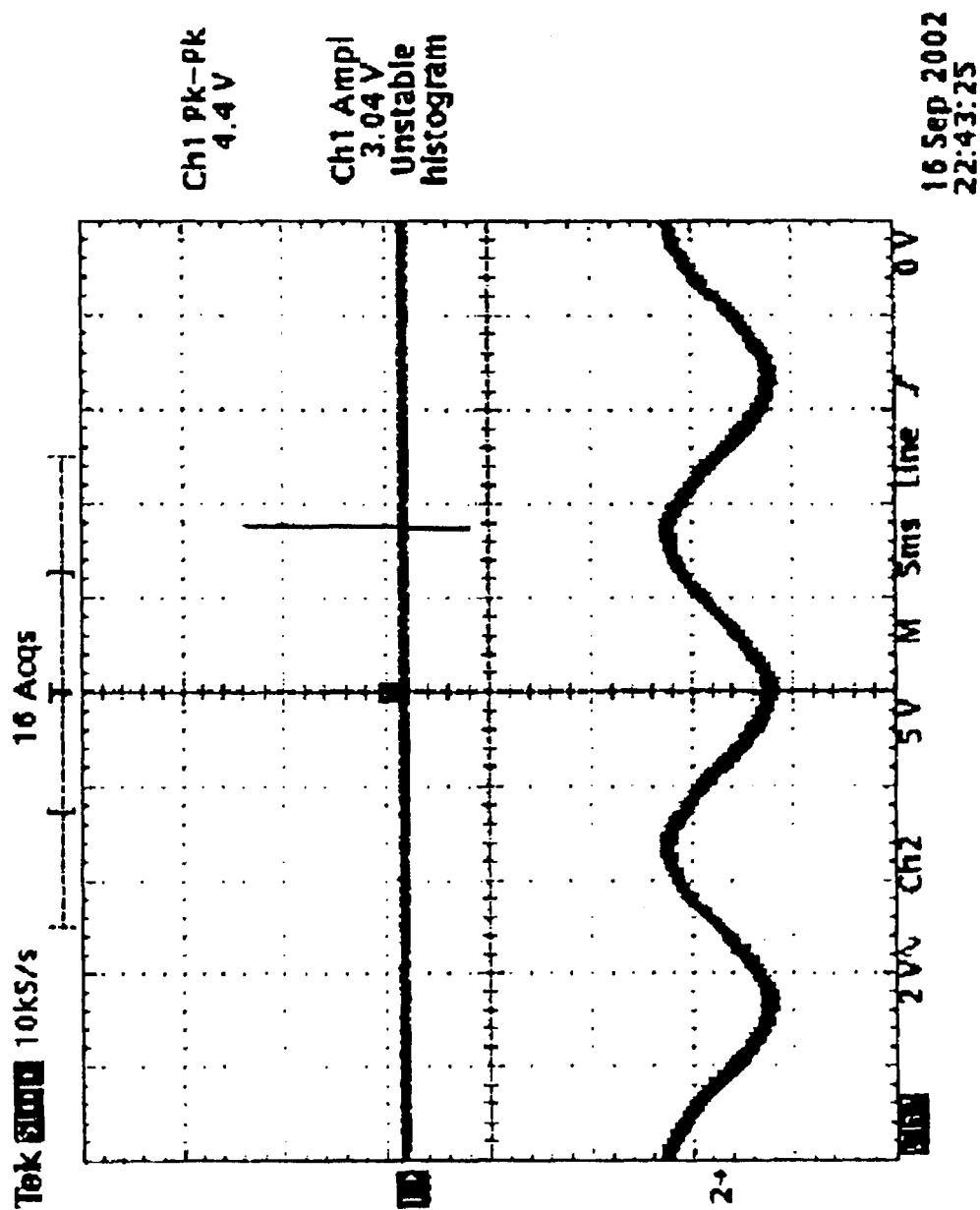
Figure 9E:
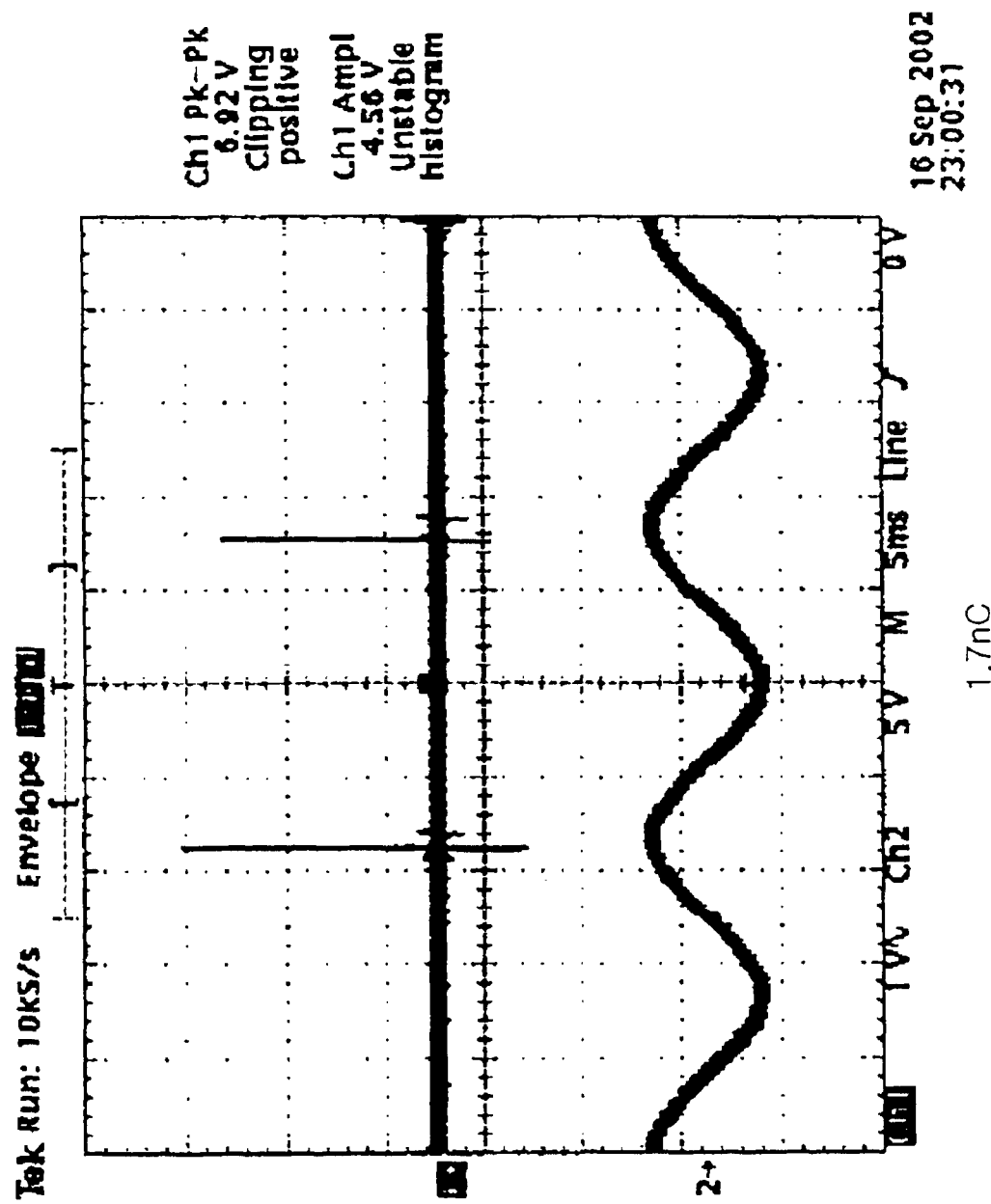
Figure 9F:
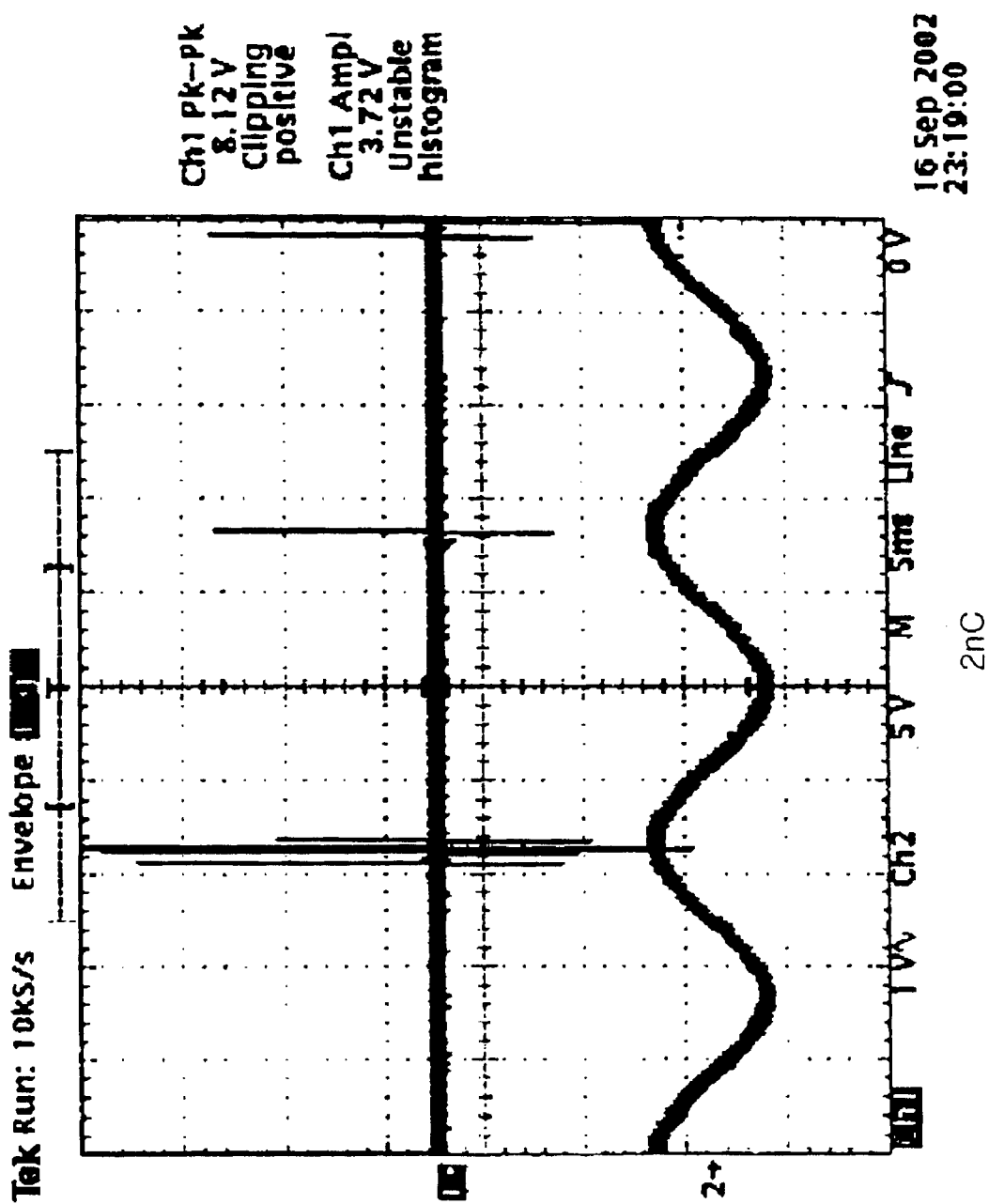

Further, FIGS. 8a and 8b are graphs showing the experimental results of corona discharge in oil using the sensor of the present invention. In detail, the results continuously measured for ten minutes over a 1 to 1.5 GHz frequency band using a max hold function by a spectrum analyzer are depicted. Referring to the measured results, a frequency band, in which the sensor of the present invention can detect intrinsic partial discharge, is shown as 1 to 200 MHz in consideration of the S/N ratio.

Further, FIGS. 9a to 9f are views showing waveforms measured by an oscilloscope according to the amounts of discharge using the hybrid type sensor 10. Referring to FIGS. 9a to 9f, it can be seen that, even though the amount of discharge is small, the response characteristics of the sensor 10 are desirable. Further, a high S/N ratio indicates that the sensitivity characteristics of the sensor 10 are desirable.

Figure 10:
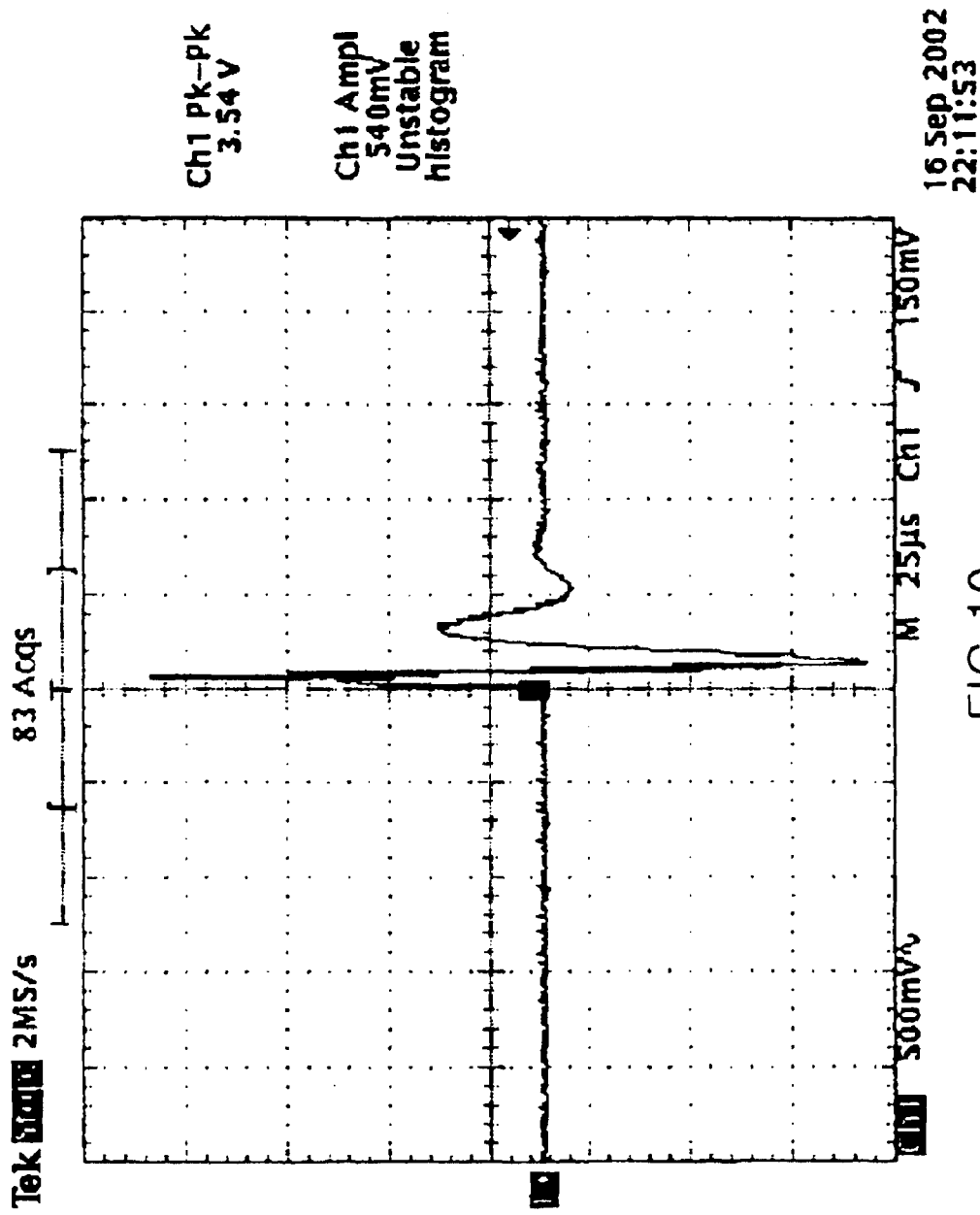
FIG. 10 is a graph showing a single shot of corona discharge in oil, measured by the sensor of the present invention.

Further, FIG. 10 is a view showing a single shot of the corona discharge in oil, which is detected by the hybrid type sensor of the present invention. It can be seen from FIG. 10 that power noise is not included in the measured waveform and the occurrence of oscillations is reduced.

Figure 11A:
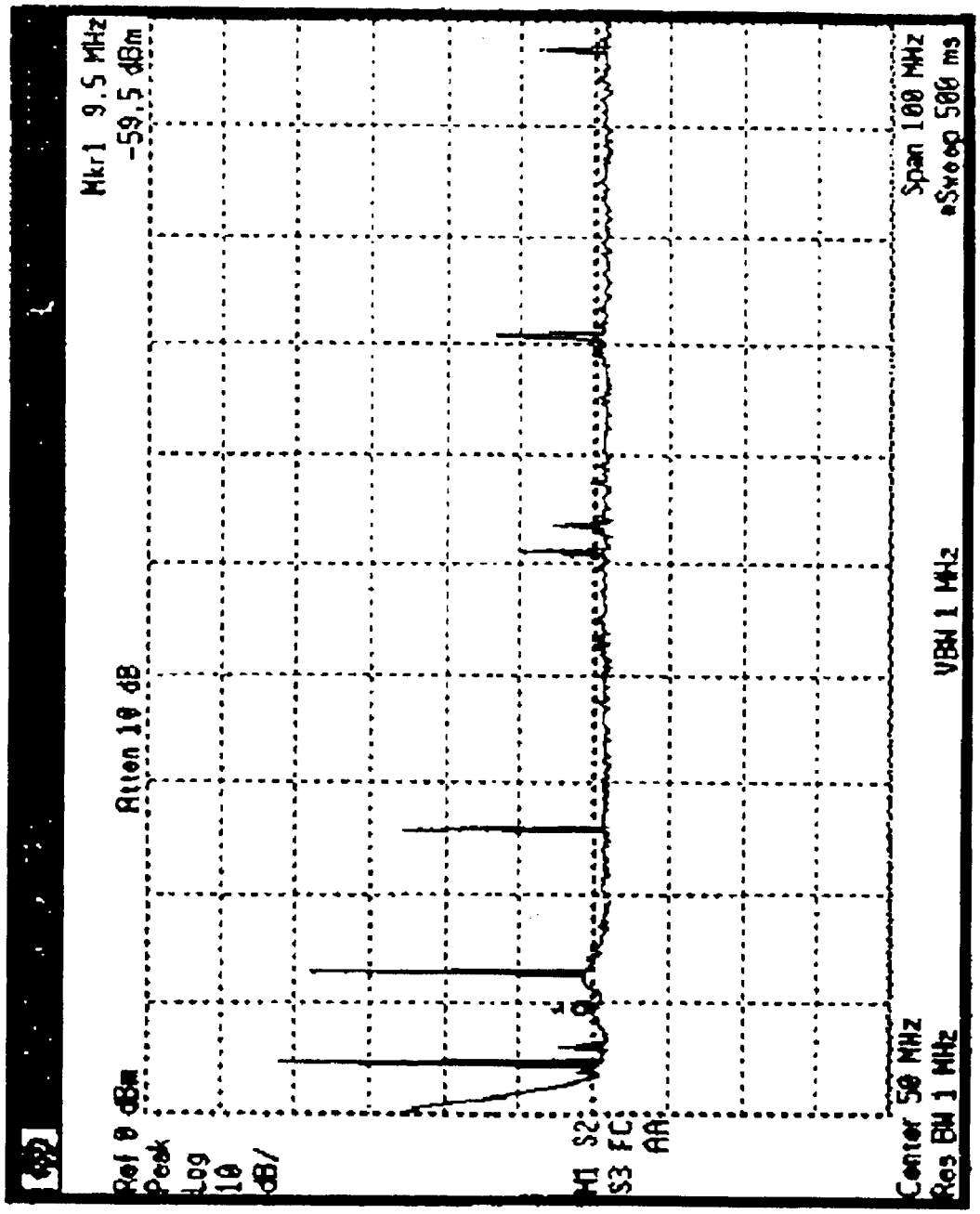
FIGS. 11a to 11c are views showing spectra of measured signals according to time variations of the hybrid type sensor of the present invention.
Figure 11B:
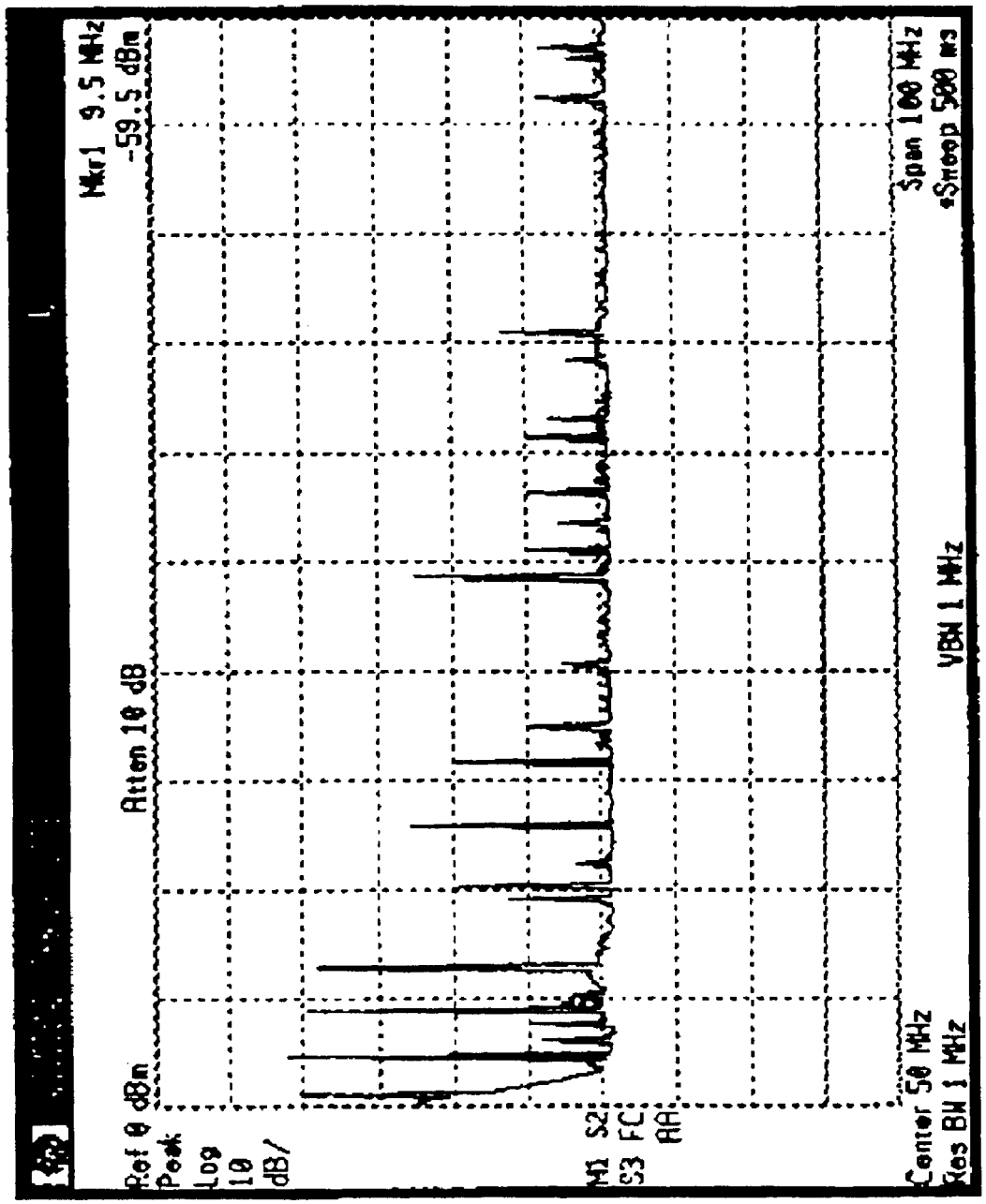
Figure 11C:
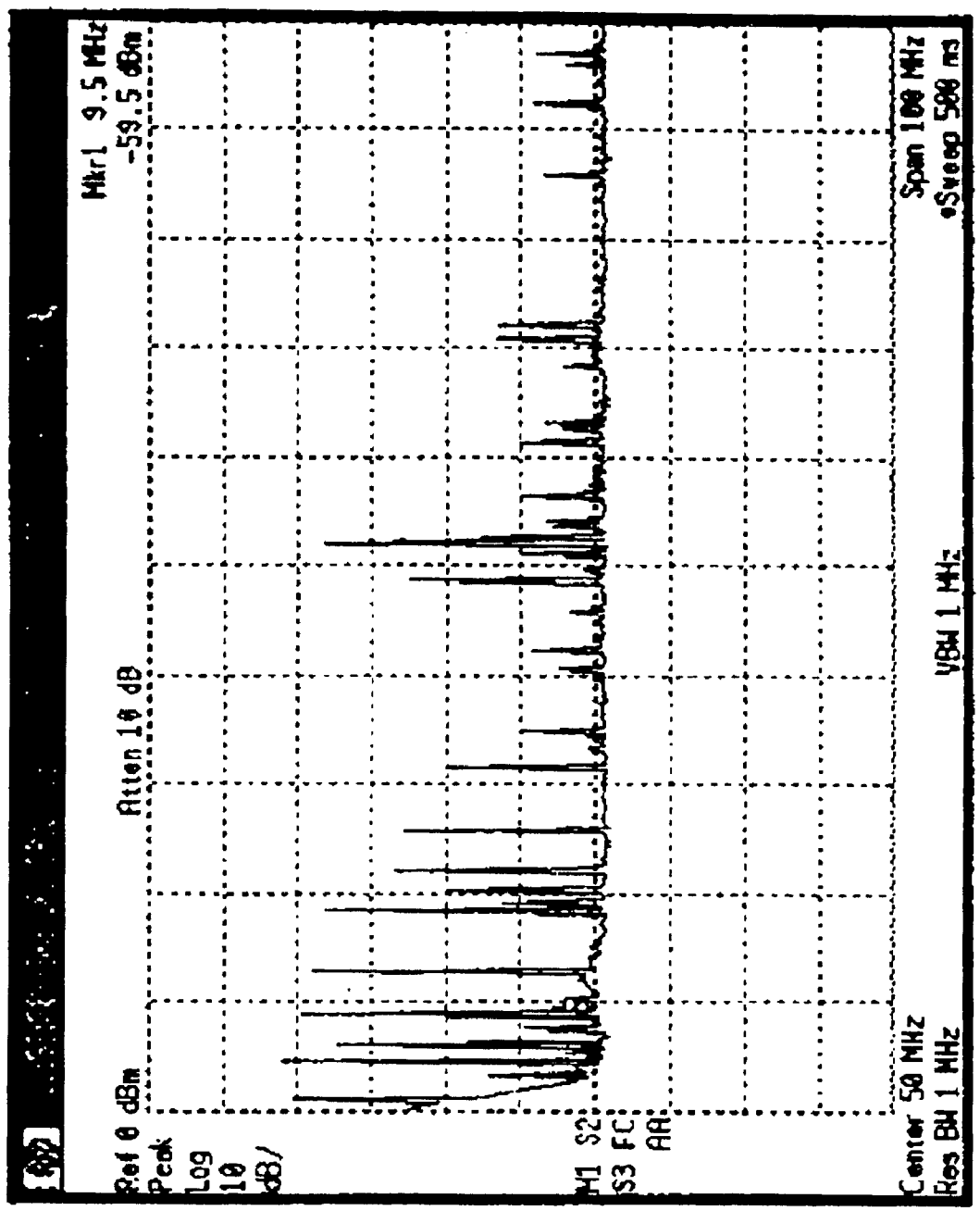

FIGS. 11a to 11c are views showing the spectra of output signals according to time variations of the hybrid type sensor of the present invention. Specifically, FIG. 11a shows a probability that a frequency band is detected at an initial time, and FIG. 11c shows a probability that a frequency band is detected after a predetermined period has elapsed. As shown in FIG. 11c, as time elapses, the measured waveform approaches that of FIG. 7.

Referring to the above measured results, it can be seen that the hybrid type partial discharge detecting sensor of the present invention reduces the input of low frequency surrounding noise components including power noise, increases a S/N ratio to improve measurement sensitivity, and guarantees safety against the inflow of a high current to the sensor due to the occurrence of an accident.

Experiment 1

Figure 12:
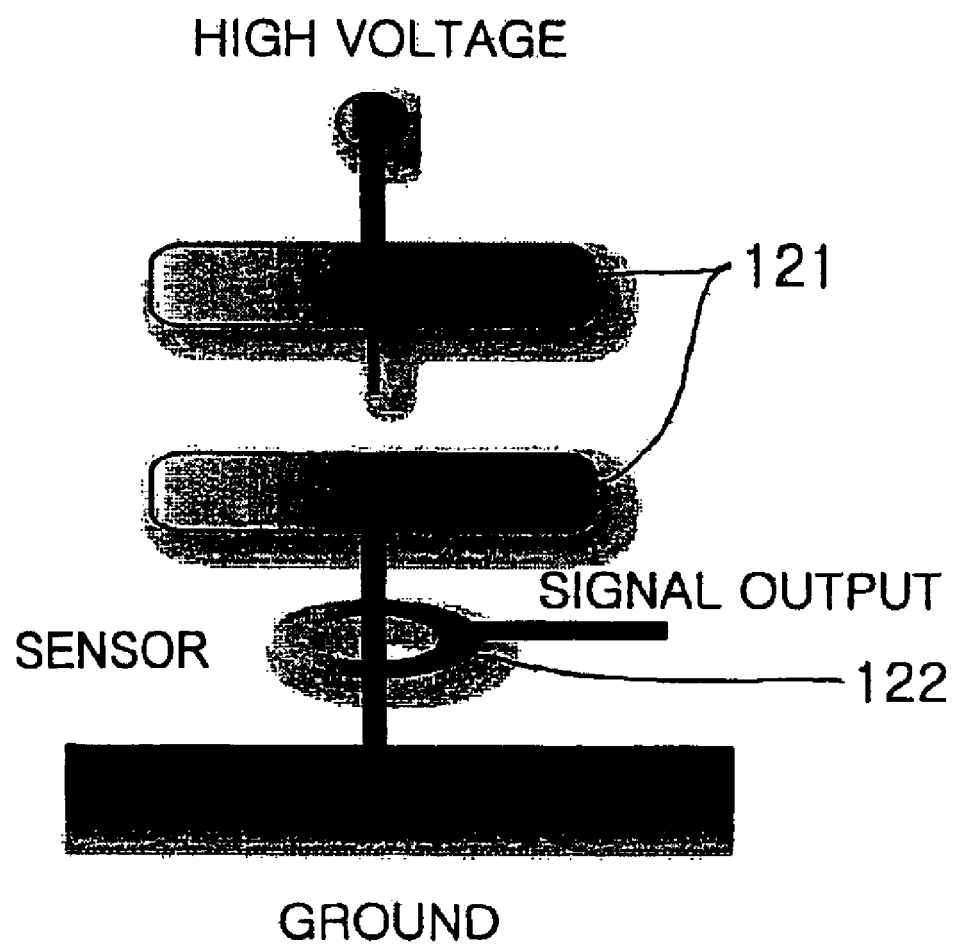
FIG. 12 is a view showing an experimental setup for measuring corona discharge using parallel-plate electrodes.

An experiment for measuring discharge in air performed in parallel-plate electrodes using the hybrid type sensor of the present invention was carried out. The experiment was carried out in such a way that a sensor 122 of the present invention is installed at a ground side of parallel-plate electrodes 121, which are inspection objects, to be perpendicular to a current direction as shown in FIG. 12. Further, in order to objectively compare the performance of the sensor of the present invention with that of another sensor, results measured by both the sensor of the present invention and a general CT type sensor with respect to an equal measurement object are compared with each other. The general CT type sensor is commercialized by Power Diagnostics (PD) Corporation and recognized as international high frequency partial discharge measuring equipment. In the experiment, a frequency band for the partial discharge measurement is 1 MHz to 100 MHz. The CT type sensor of the PD Corporation was installed at the same position as the sensor of the present invention.

Figure 13:
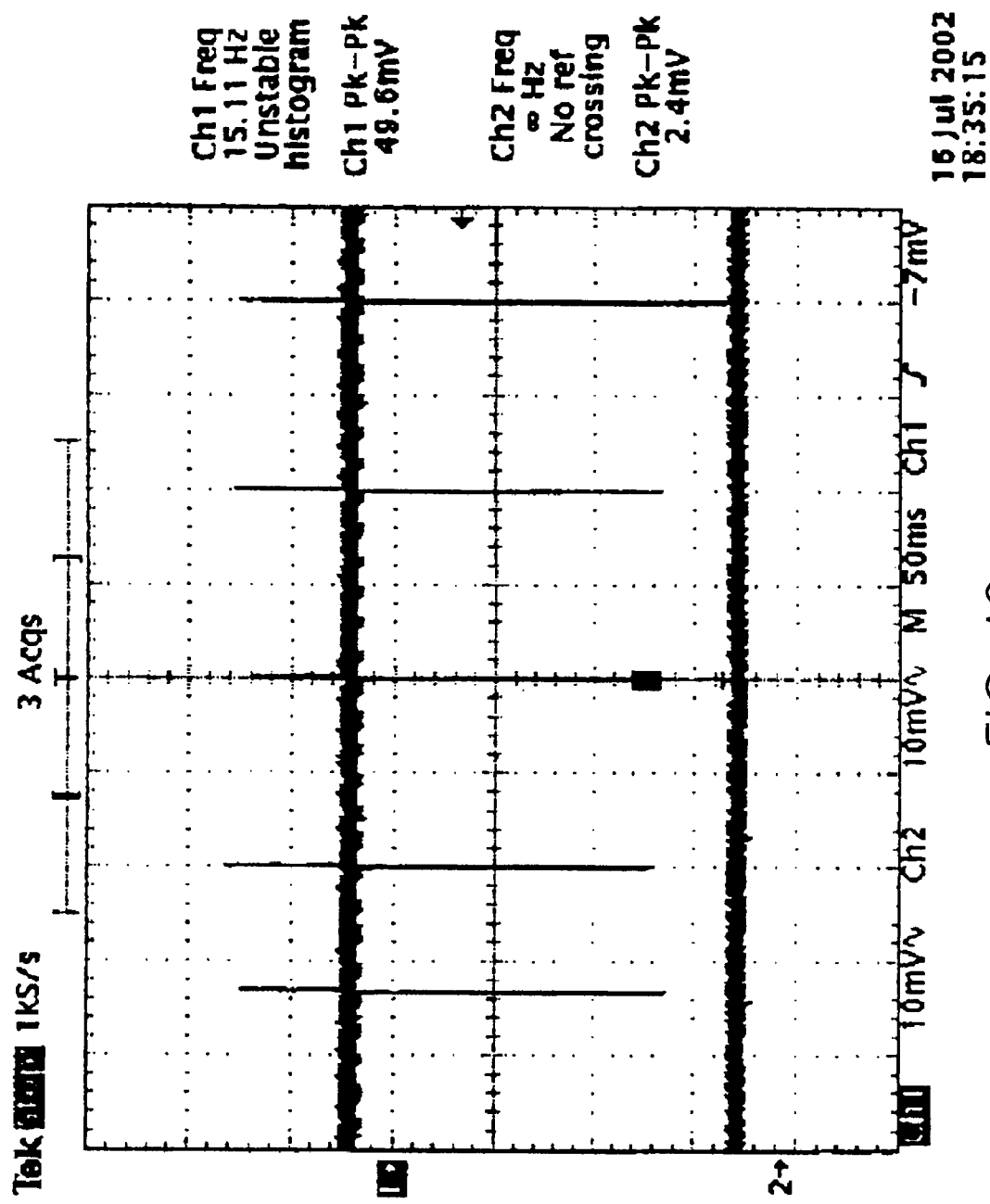
FIG. 13 is a graph comparing the sensitivities of a conventional CT type sensor of PD Corporation and the sensor of the present invention.

FIG. 13 is a view comparing the measurement sensitivities of two sensors installed as shown in FIG. 12 with each other, in which CH1 indicates the measurement sensitivity of the sensor of the present invention, and CH2 indicates the measurement sensitivity of the CT type sensor for 100 MHz of the PD Corporation. As shown in an actual corona measured waveform of FIG. 13, it can be seen that, in the case where the amount of discharge of 16 pC is equally generated by the two sensors and measurements are simultaneously carried out at the same position, the CT type sensor of the PD Corporation cannot measure the corona discharge under the same conditions, while the hybrid type sensor can detect corona discharge at a high S/N ratio. Further, referring to the waveform of FIG. 13, it can be seen that power noise is not included in the results measured by the sensor of the present invention.

Figure 14:
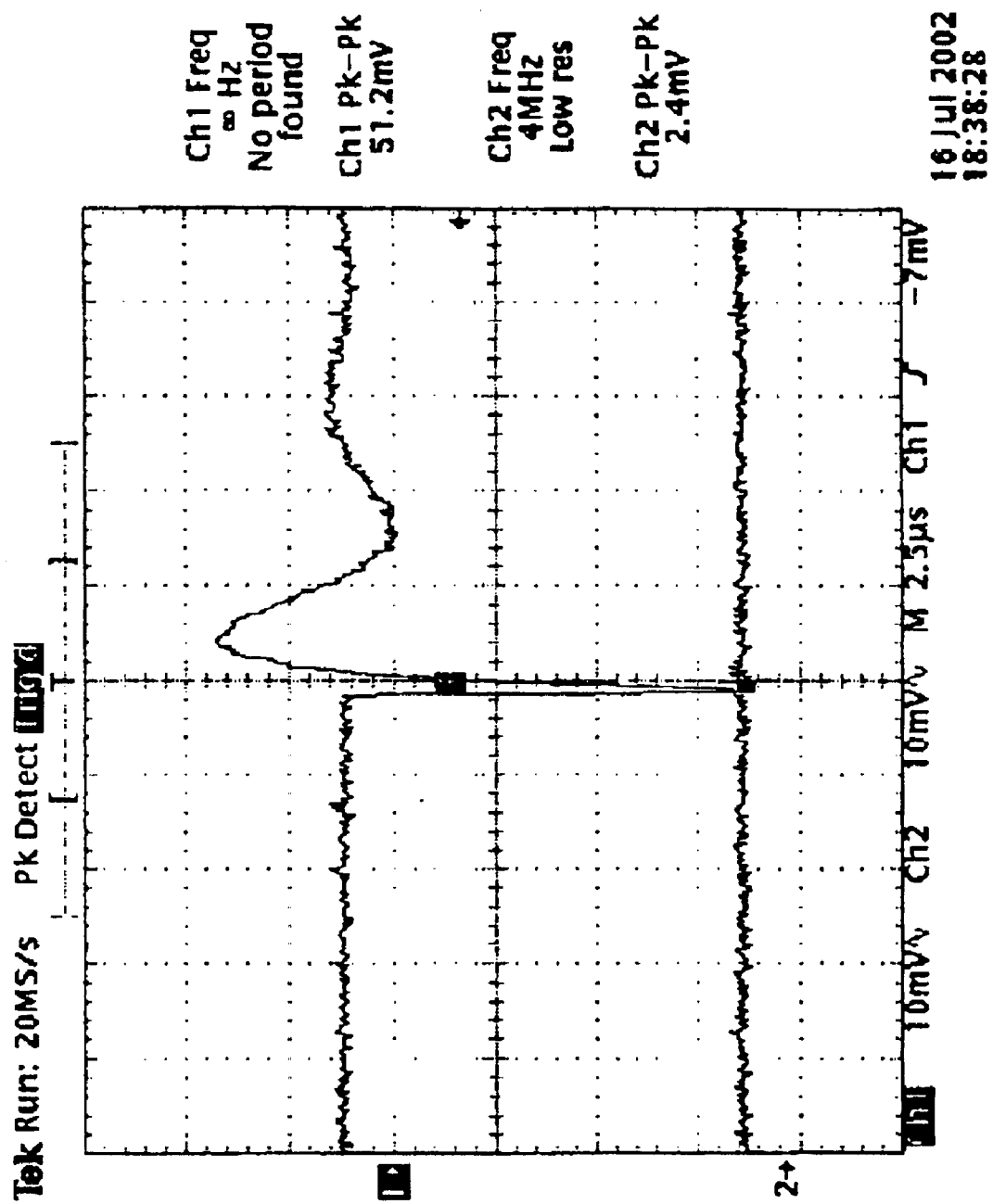
FIG. 14 is a graph showing results of corona discharge measurement of the conventional CT type sensor of the PD Corporation and the sensor of the present invention.

Further, FIG. 14 is a view showing a measured waveform CH2 of the CT type sensor of the PD Corporation and a measured waveform CH1 of the hybrid type sensor with respect to a single corona discharge signal. As shown in FIG. 14, in the sensor of the present invention, an output waveform thereof was shown to be similar to a response waveform of a typical shunt type sensor, and oscillations and power noise components was greatly reduced compared to the CT type sensor. On the contrary, the CT type sensor of the PD Corporation could not absolutely detect partial discharge.

Experiment 2

Then, in order to measure insulated conditions of a coil of a stator and a yoke of an electric motor using the hybrid type sensor of the present invention, an experiment for detecting the amount of partial discharge was carried out.

At this time, a 50 hp electric motor by Hyosung Corporation of Korea was used as a sample of the experiment for detecting partial discharge generated in the electric motor.

Figure 15:
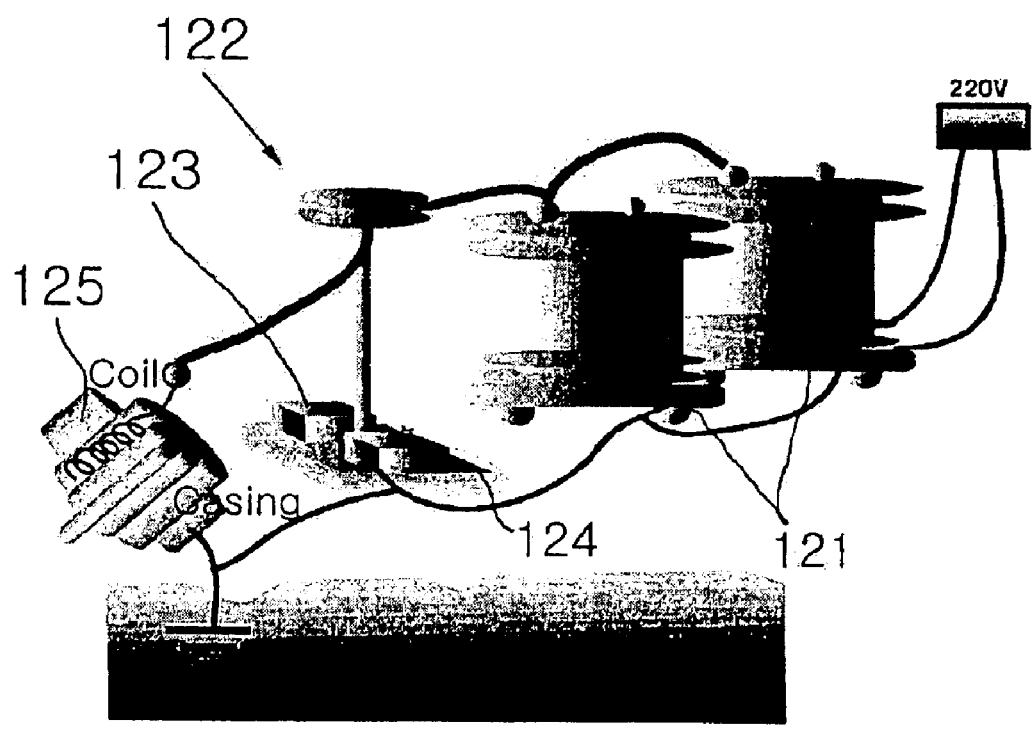
FIG. 15 is a view showing an experimental setup for measuring partial discharge of an electric motor.

Further, as shown in FIG. 15, a transformer 121 transforms a power voltage of 220V into a drive voltage (direct current voltage or alternating current voltage) required for an electric motor 125, the electric motor 125 is comprised of a coil unit supplied with power from the transformer 121 and a grounded yoke, a coupling capacitor 122 is connected in parallel with the electric motor 125, and a voltage divider 123 and a sensor 124 are connected to the coupling capacitor 122. Further, the experiment for the partial discharge was carried out within a shield room while the sensor of the present invention was compared with equipment TE 571 of Halfey complying with IEC 270 standard.

Figure 16:
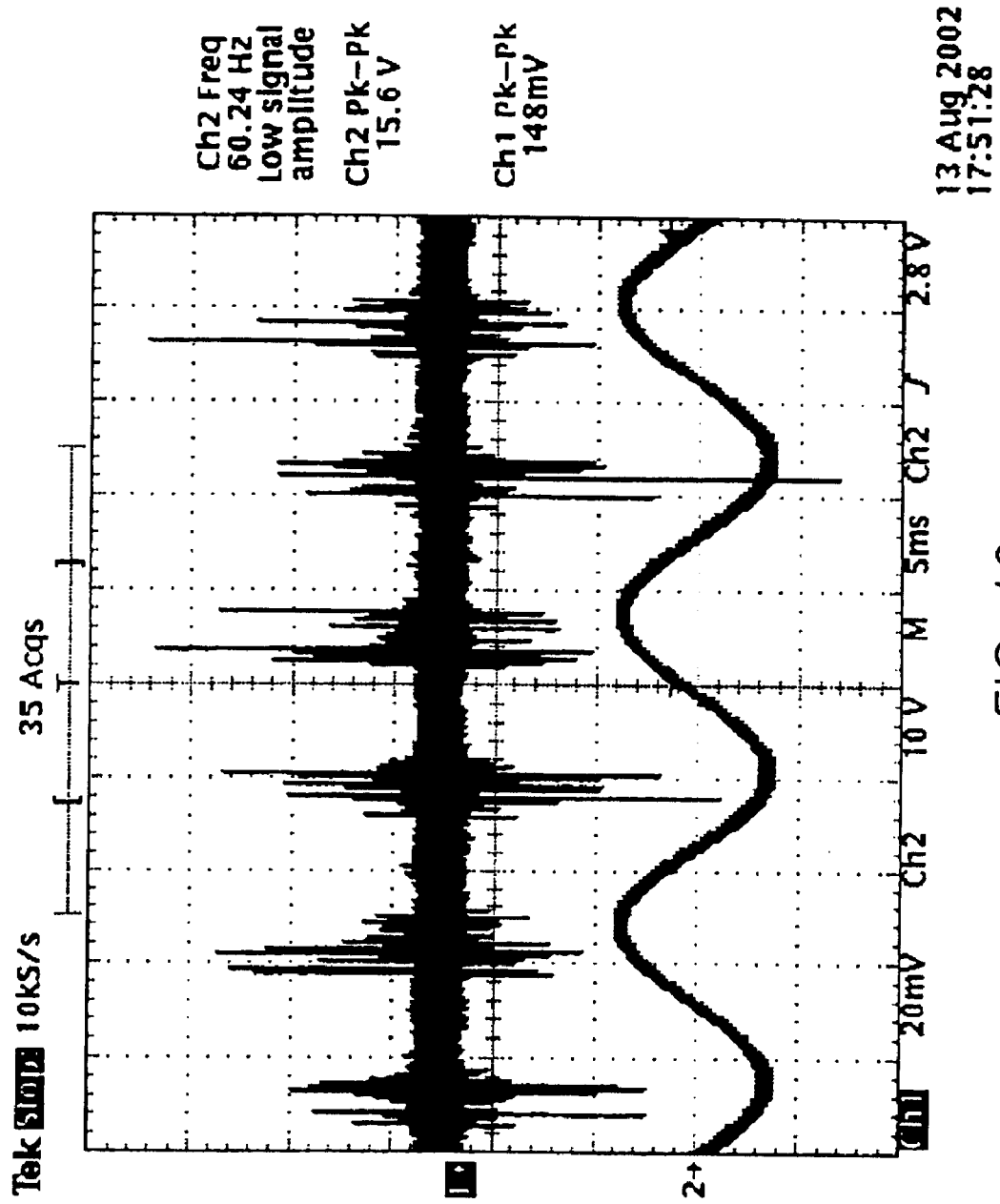
FIG. 16 is a graph showing results of measurement of high frequency partial discharge in a 50 hp electric motor according to the present invention.

FIG. 16 is a waveform diagram showing a partial discharge signal detected by the 50 hp electric motor 125. It can be seen that partial discharge occurs at positions of positive and negative peak values of input power. In this case, the power waveform of CH2, obtained by using the voltage divider, is used to measure a phase delay due to the input power and the inductance component of the hybrid type sensor. As the result of measurement, the phases of partial discharge signals of both the TE 571 and the hybrid type sensor were equal without a phase delay.

In the above description, it can be seen that the hybrid type sensor of the present invention does not influence the phase of the measuring circuit.

Figure 17:
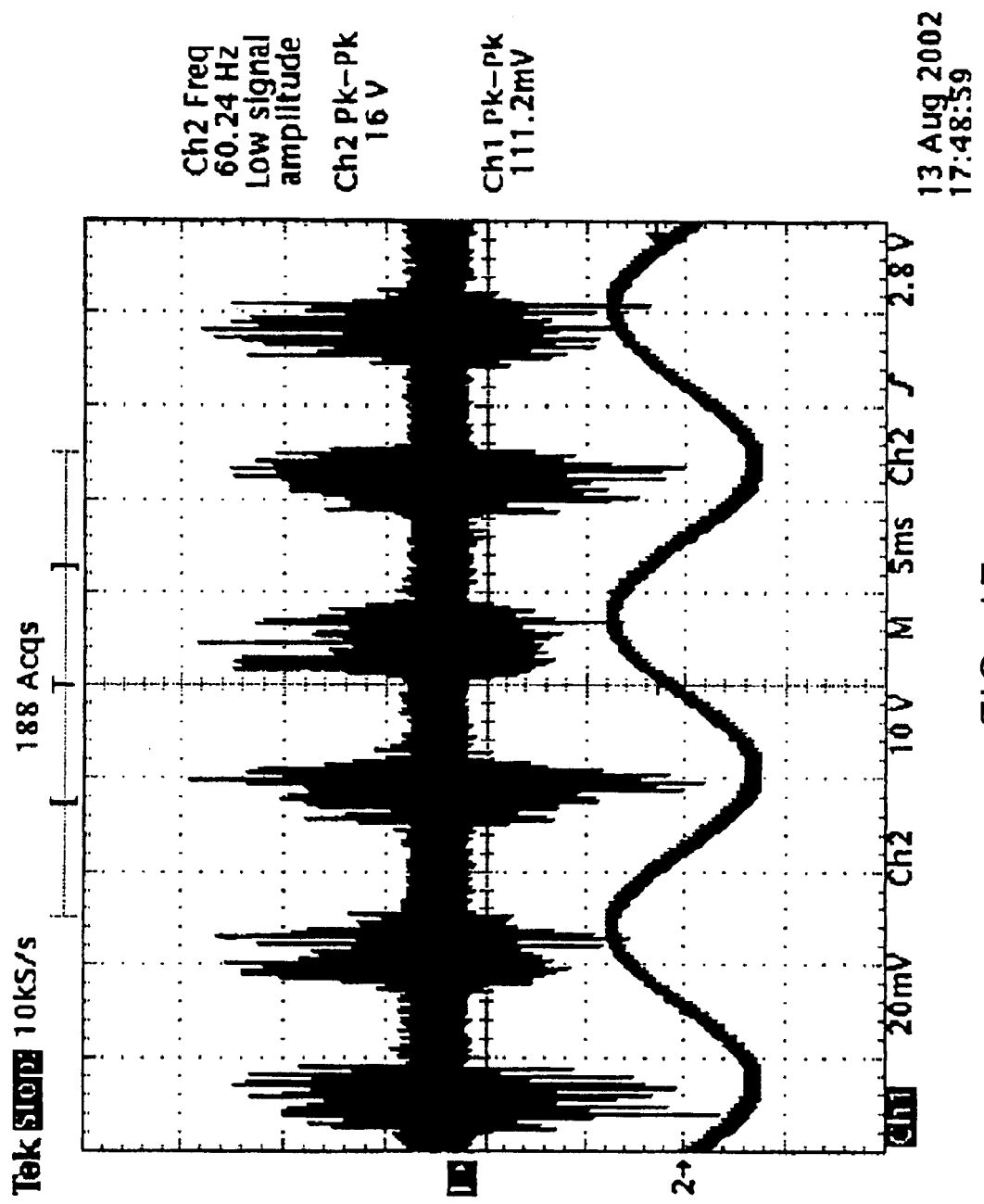
FIG. 17 is a graph showing results of measurement of high frequency partial discharge in a stator of an electric motor according to the present invention.

Next, FIG. 17 is a waveform diagram of a partial discharge detection signal measured at the stator of the electric motor, in which the partial discharge occurred exactly at positions of positive and negative peak values of the input power. FIG. 17 shows that S/N ratio and sensitivity are superior and a noise component signal is not generated in other phases.

From the above measured results, it can be proved that the hybrid type sensor of the present invention is better than the conventional CT type sensor in factors, which must be technically considered, such as sensitivity, S/N ratio and the shape of a waveform, at the time of measurement of partial discharge. Further, even in the case of the experiment for measuring partial discharge of the electric motor, phase variations due to the impedance of the sensor itself do not occur. Thus, it can be proved that the sensitivity for enabling a signal to be distinguished from a noise in measurement is improved.

Figure 18A:
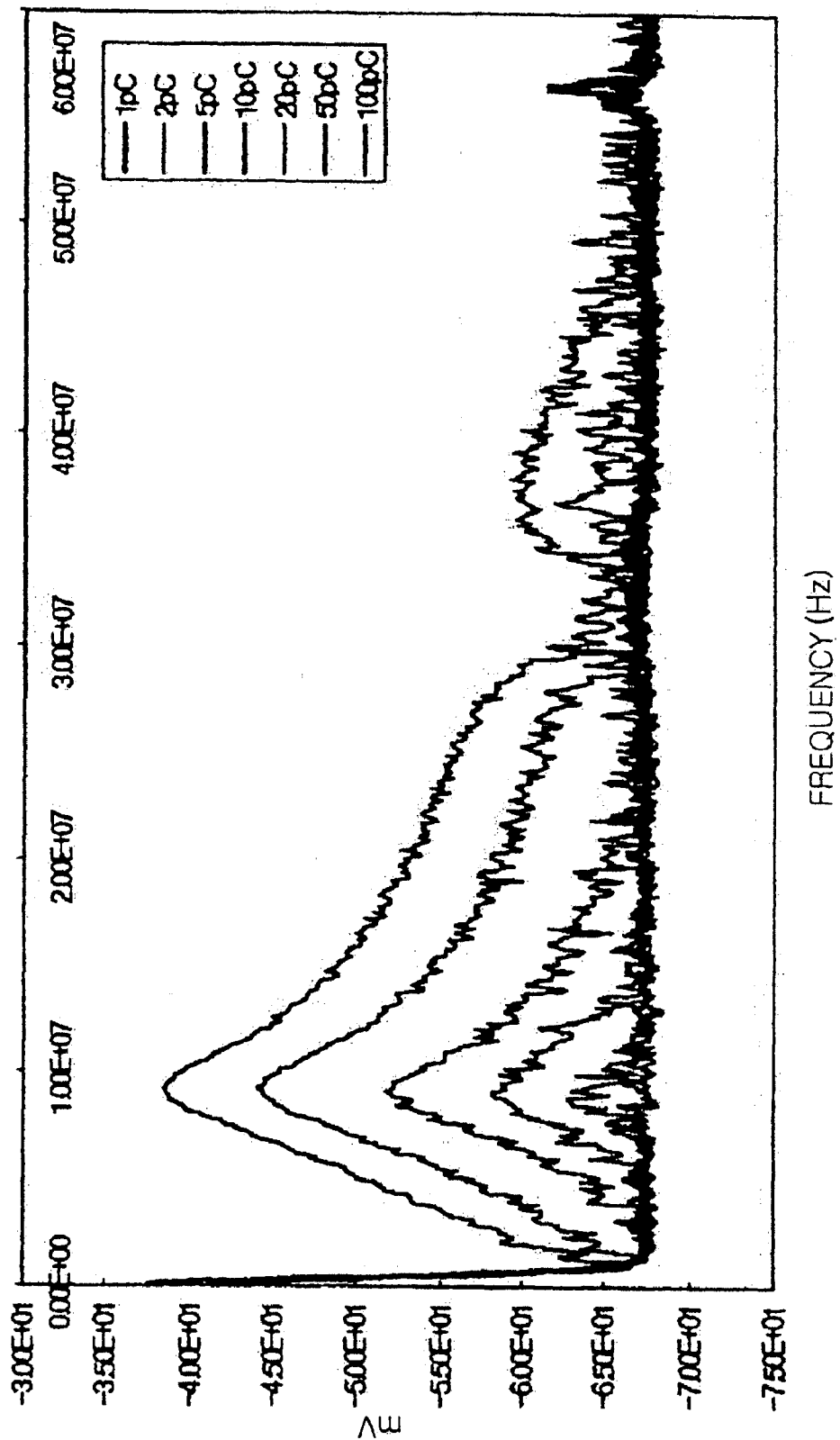
FIGS. 18a to 18c are graphs showing relationships between frequencies and output signals according to the amounts of discharge of the conventional CT type sensor, a conventional shunt type sensor and the sensor of the present invention, respectively.
Figure 18B:
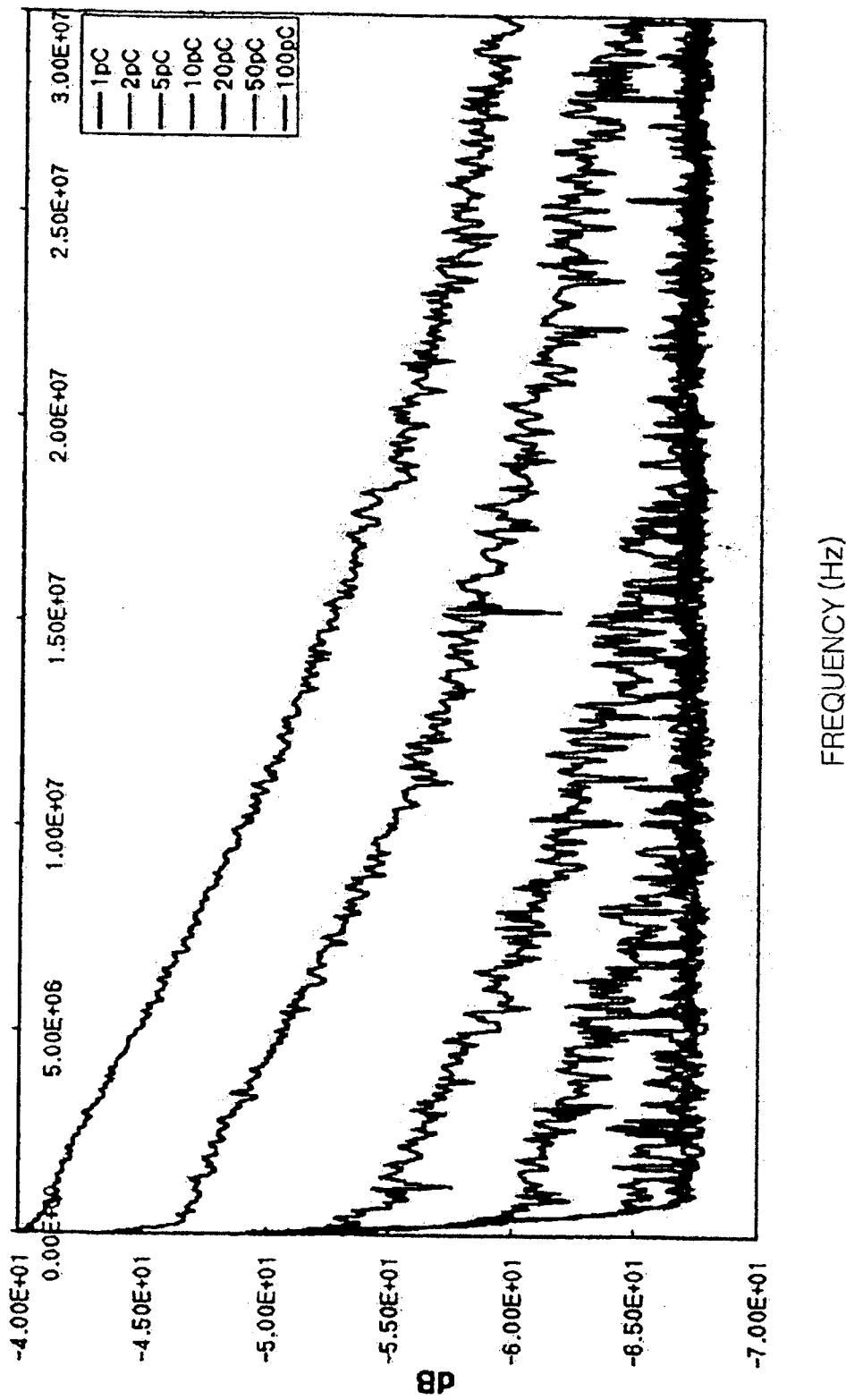
Figure 18C:
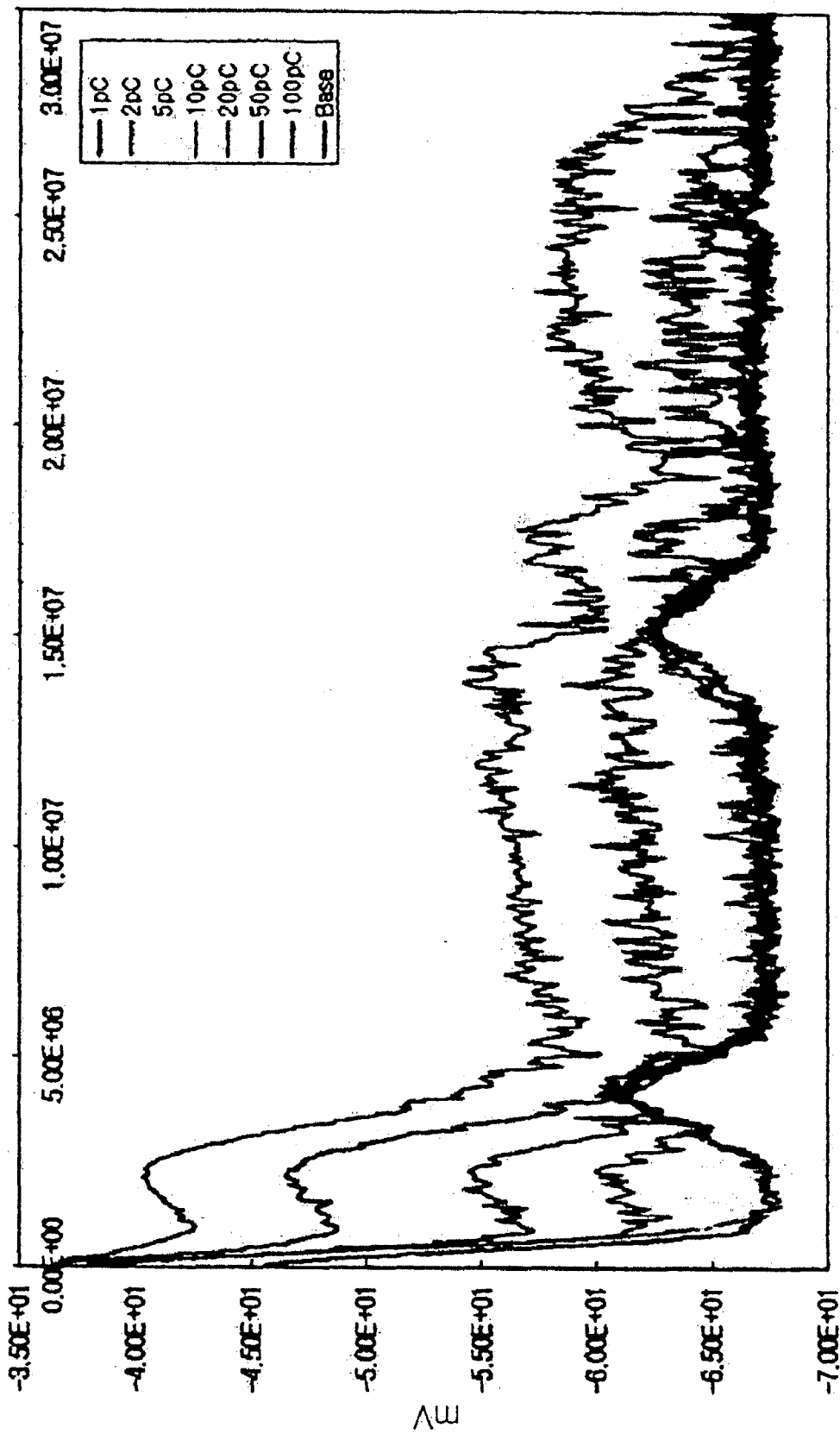

FIGS. 18a to 18c are graphs comparing response curves of the conventional CT type sensor, the conventional shunt type sensor and the hybrid type sensor of the present invention, in which the response curves of the conventional CT type sensor, the shunt type sensor and the hybrid type sensor are depicted in FIGS. 18a to 18c, respectively.

As compared in FIGS. 18a to 18c, in the case of the CT type sensor, maximum resonance occurs at a position adjacent to 9.6 MHz. Further, in the case of the shunt type sensor, linear characteristics are shown over an entire frequency band. Further, in the case of the hybrid type sensor of the present invention, sensitivity equal to or less than 2 pC is shown in a 1 to 3 MHz frequency band, so that the sensitivity of the 1 to 3 MHz frequency band clearly differs from those of other frequency bands.

Figure 19:
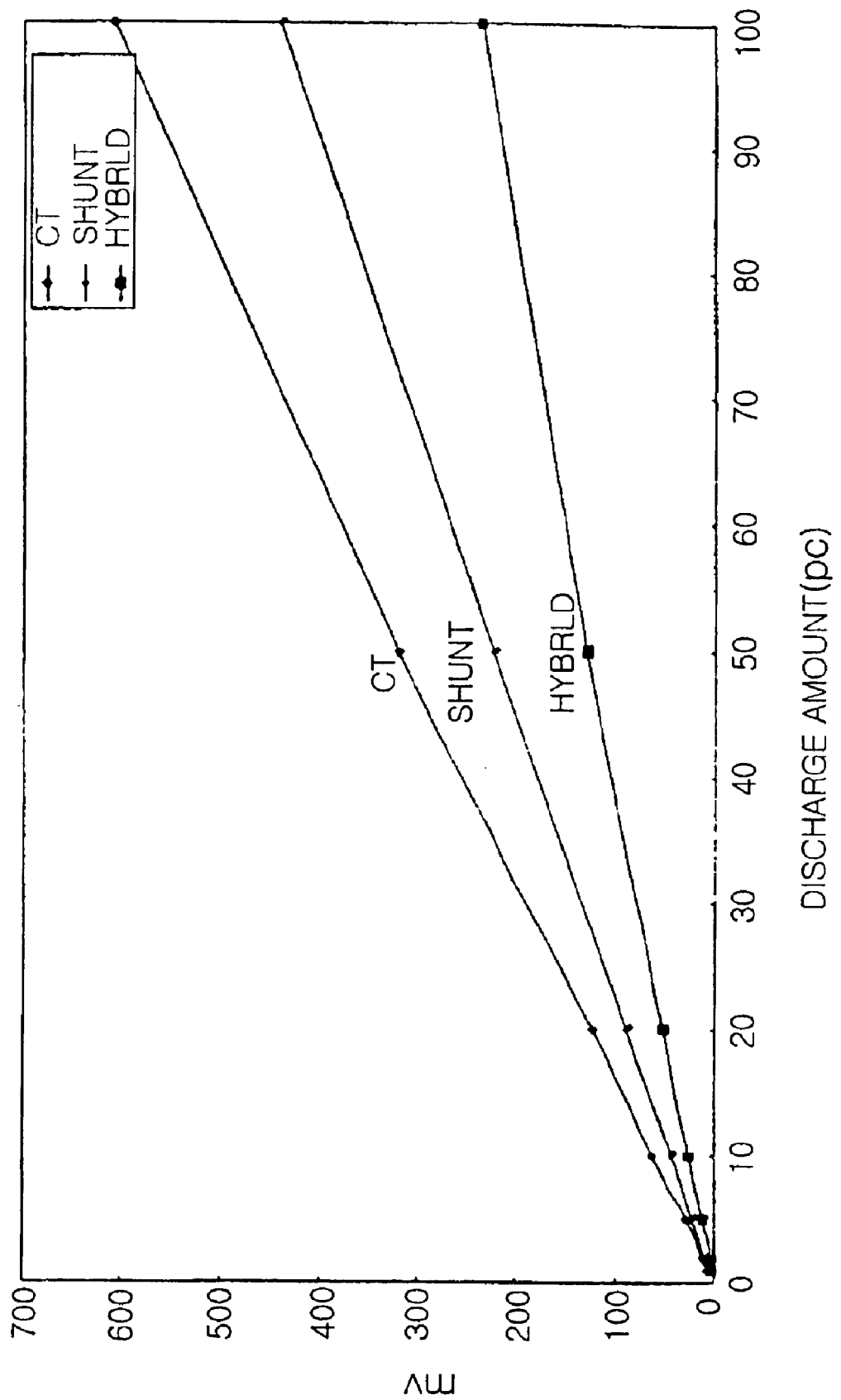
FIG. 19 is a graph comparing response characteristics to the amount of discharge of the conventional CT type sensor, the conventional shunt type sensor and the sensor of the present invention.

FIG. 19 is a graph comparing output voltages versus the amounts of discharge of the conventional CT type sensor, the conventional shunt type sensor, and the hybrid type sensor of the present invention. As shown in FIG. 19, the magnitudes of the responses decrease in the order of the CT type sensor, the shunt type sensor and the hybrid type sensor. The reason that the magnitude of the response of the CT type sensor is largest is that, since the measurement is performed in a peak-to-peak manner, the sum of both positive and negative peak values of the CT type sensor with largest oscillation is shown as a largest value. Therefore, with the magnitudes of the responses with taken into consideration, the magnitudes of actual responses decrease in the order of the shunt type sensor, the CT type sensor and the hybrid type sensor.

Figure 20A:
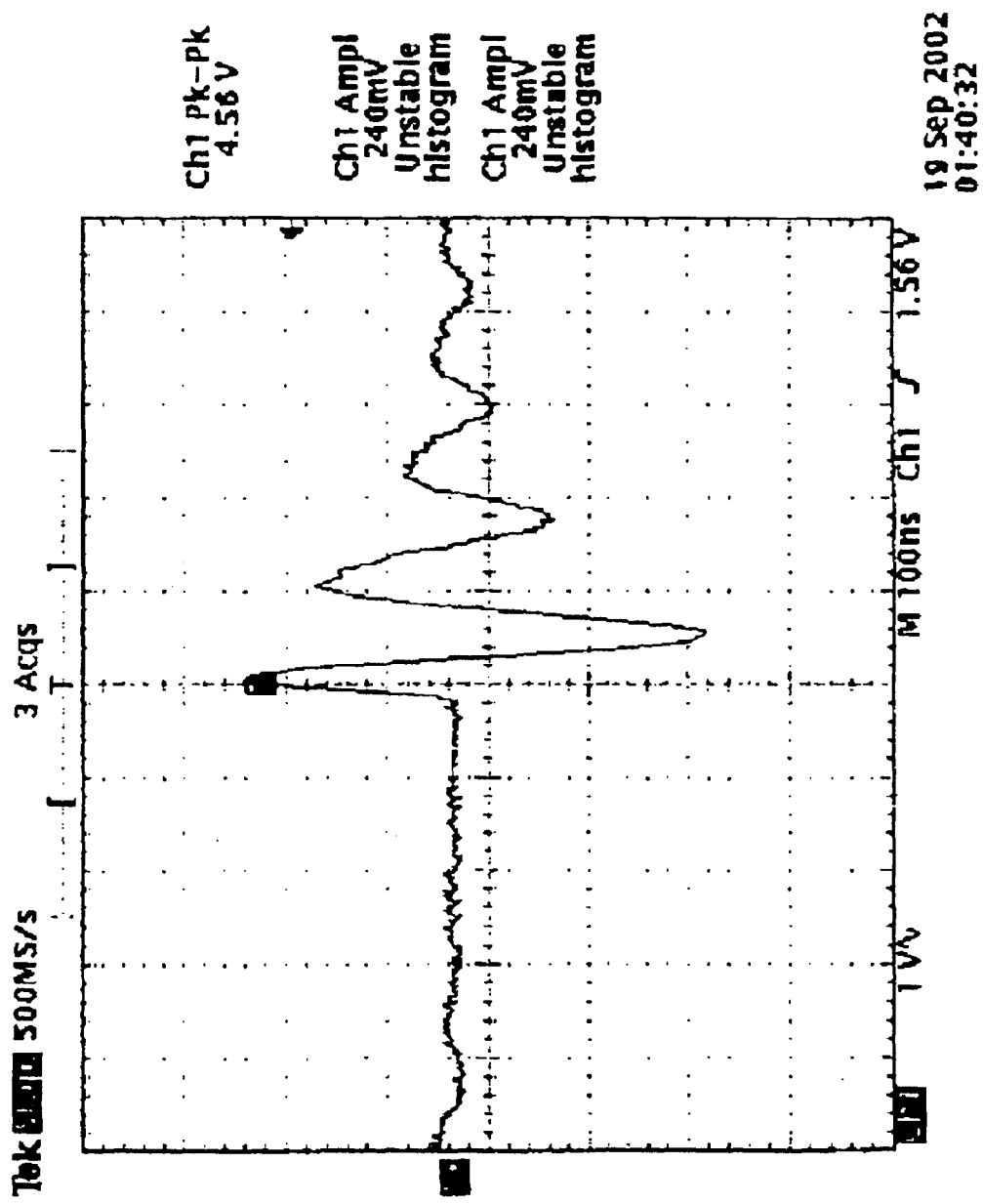
FIGS. 20a to 20c are graphs comparing the results of measurement of corona discharge in oil, performed by the conventional CT type sensor, the conventional shunt type sensor and the hybrid type sensor of the present invention.
Figure 20B:
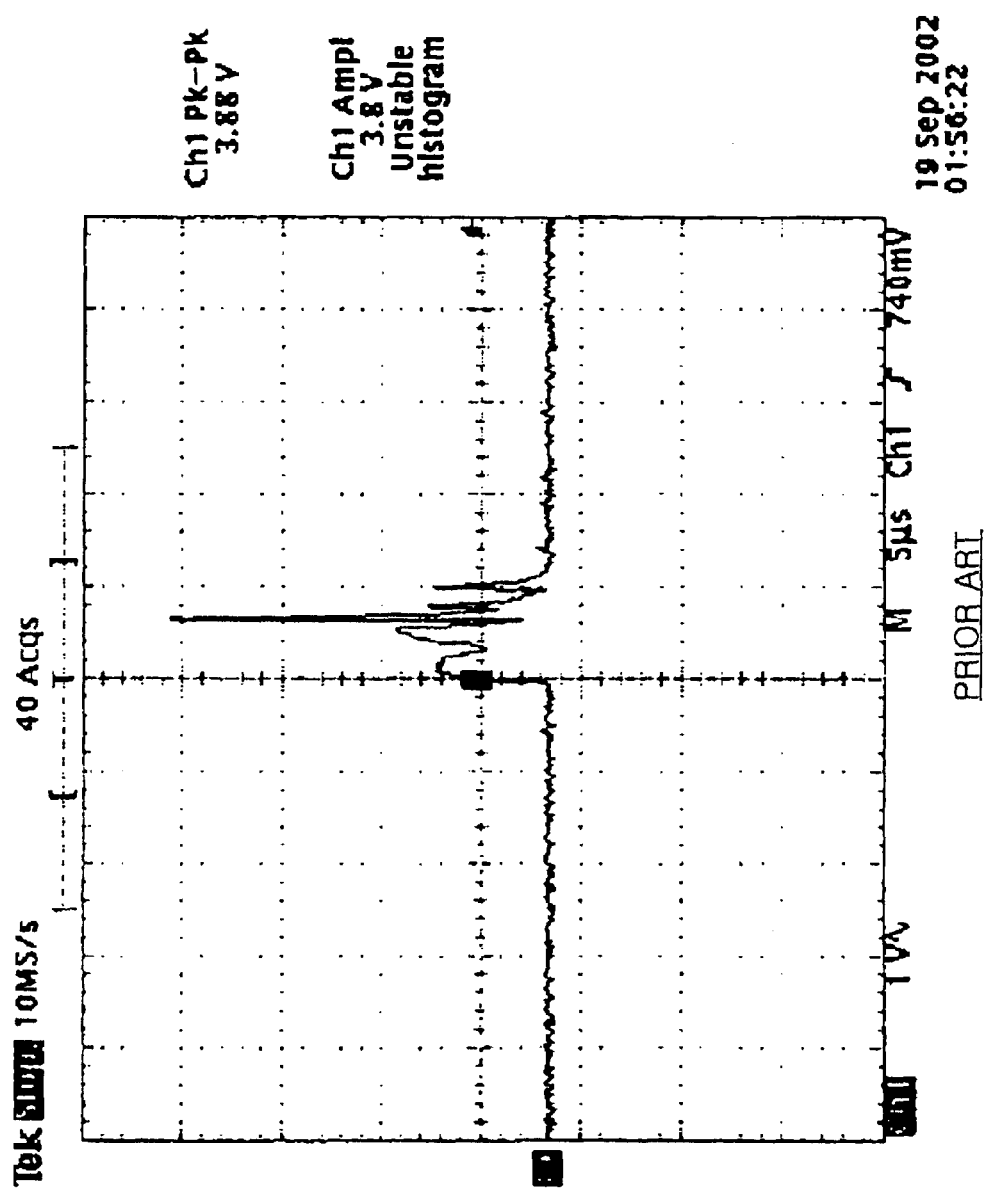
Figure 20C:
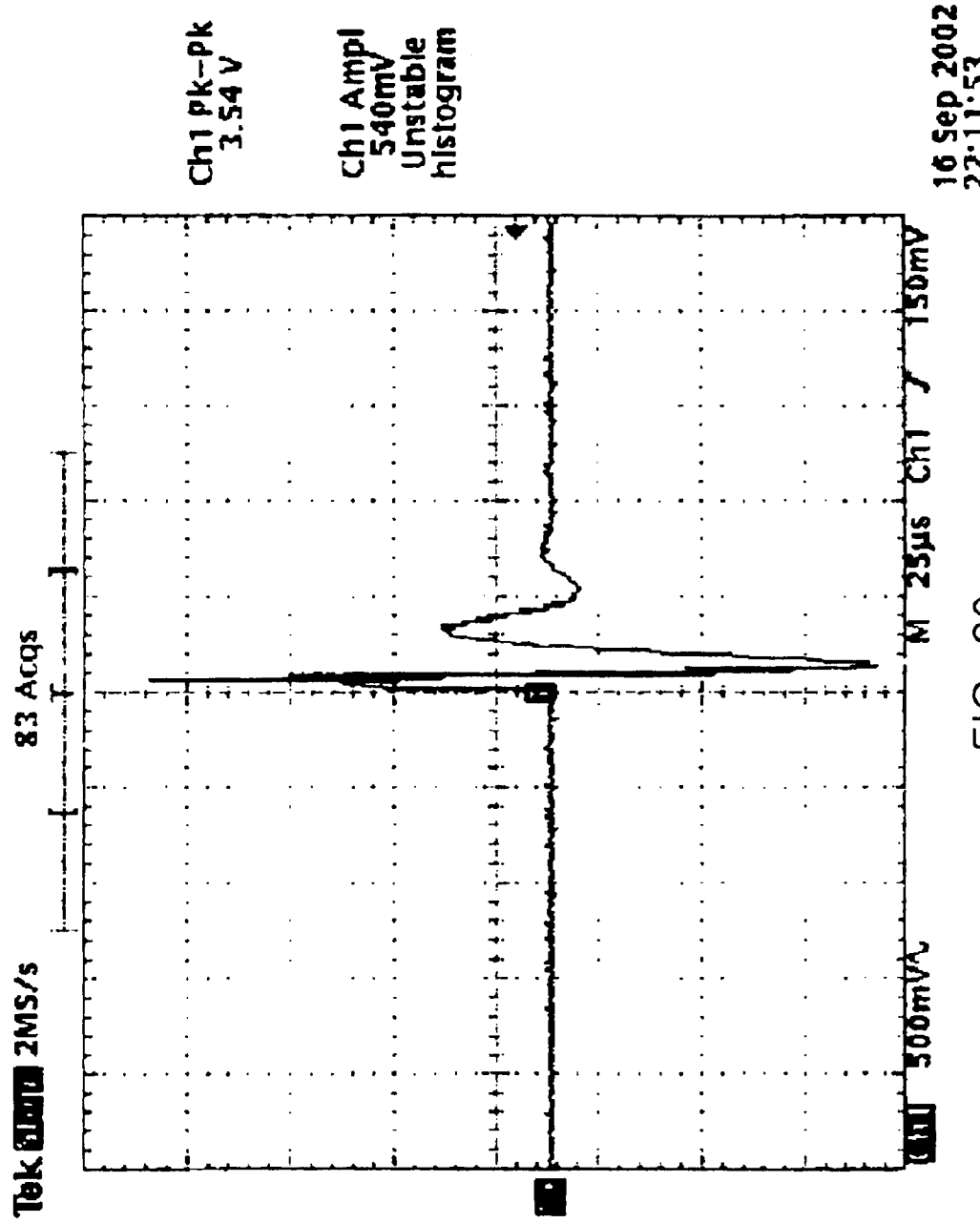

FIGS. 20a to 20c are graphs comparing single shots of the conventional CT type sensor, the conventional shunt type sensor and the hybrid type sensor of the present invention at the time of measuring corona discharge in oil, in which the waveforms of single shots of the CT type sensor, the shunt type sensor and the hybrid type sensor are depicted in FIGS. 20a to 20c, respectively. As shown in FIGS. 20a to 20c, it can be seen that the CT type sensor causes many oscillations in the waveform thereof, while the hybrid type sensor can obtain rapid response characteristics including oscillations fewer than those of the CT type sensor.

As described above, the present invention provides a hybrid type sensor for detecting partial discharge, which can reduce the occurrence of oscillations and improve measurement sensitivity compared to a conventional CT type sensor, and have high elimination efficiency for surrounding noise including power noise to obtain a S/N ratio higher than a conventional shunt type sensor, and which can guarantee the safety of a measuring device by protecting the sensor if a surge voltage is input to the measuring device when an accident occurs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A hybrid type sensor for detecting high frequency partial discharge of a power device, comprising:

a first measurement terminal electrically connected to a measurement point of a power device, which is an inspection object, to receive a power signal to be inspected;

a second measurement terminal connected to ground to output the power signal to be inspected;

a first impedance forming unit disposed between the first and second measurement terminals and implemented to have a low impedance including an inductive reactance component, thus forming a first path that allows a low frequency signal to pass therethrough;

a second impedance forming unit disposed between the first and second measurement terminals, connected in parallel with the first impedance forming unit and implemented to have a high impedance including a capacitive reactance component, thus forming a second path that allows a high frequency partial discharge current to pass therethrough;

a detecting unit connected in series between the second impedance forming unit and the second measurement terminal to convert an amount of the high frequency partial discharge current passing through the second path into measurement signals having a predetermined shape; and first and second output terminals for outputting positive and negative measurement signals having a predetermined shape detected by the detecting unit, respectively.

2. The hybrid type sensor according to claim 1, wherein the first impedance forming unit is implemented as an inductor with a predetermined inductance having both ends connected to the first and second measurement terminals.

3. The hybrid type sensor according to claim 1, wherein the second impedance forming unit is implemented as a ceramic capacitor without a lead wire.

4. The hybrid type sensor according to claim 1, wherein the detecting unit is implemented as a chip resistor without a lead wire, the chip resistor being disposed between the second impedance forming unit and the second measurement terminal.

5. The hybrid type sensor according to claim 1, further comprising a dummy inductor disposed between the first and second impedance forming units and the second measurement terminal, thus reducing ground noise.

6. The hybrid type sensor according to claim 3, wherein the ceramic capacitor has a withstanding voltage of 10 kV or higher.

7. A hybrid type sensor for detecting high frequency partial discharge of a power device, comprising:

a first measurement terminal electrically connected to a measurement point of a power device, which is an inspection object, to receive a power signal to be inspected;

a second measurement terminal connected to ground to output the power signal to be inspected;

a first impedance forming unit disposed between the first and second measurement terminals and implemented to have a low impedance including an inductive reactance component, thus forming a first path that allows a low frequency signal to pass therethrough;

a second impedance forming unit disposed between the first and second measurement terminals, connected in parallel with the first impedance forming unit and implemented to have a high impedance including a capacitive reactance component, thus forming a second path that allows a high frequency partial discharge current to pass therethrough;

a detecting unit connected in series between the second impedance forming unit and the second measurement terminal to convert an amount of the high frequency partial discharge current passing through the second path into measurement signals having a predetermined shape;

first and second output terminals for outputting positive and negative measurement signals having a predetermined shape detected by the detecting unit, respectively; and a third impedance forming unit disposed between the first and second terminals, connected in parallel with the first and second impedance forming units and implemented to have a high impedance including a capacitive reactance, thus forming a third path that allows an ultra high frequency signal, such as a surge current, to pass therethrough.

8. The hybrid type sensor according to claim 7, wherein the first impedance forming unit is implemented as an inductor with a predetermined inductance having both ends connected to the first and second measurement terminals.

9. The hybrid type sensor according to claim 7, wherein the second impedance forming unit is implemented as a ceramic capacitor without a lead wire.

10. The hybrid type sensor according to claim 7, wherein the detecting unit is implemented as a chip resistor without a lead wire, the chip resistor being disposed between the second impedance forming unit and the second measurement terminal.

11. The hybrid type sensor according to claim 7, further comprising a dummy inductor disposed between the first and second impedance forming units and the second measurement terminal, thus reducing ground noise.

12. The hybrid type sensor according to claim 9, wherein the ceramic capacitor has a withstanding voltage of 10 kV or higher.

13. A method of detecting an amount of partial discharge using the sensor for detecting high frequency partial discharge of claim 1, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

14. A method of detecting an amount of partial discharge using the sensor for detecting high frequency partial discharge of claim 2, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

15. A method of detecting an amount of partial discharge using the sensor for detecting high frequency partial discharge of claim 3, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

16. A method of detecting an amount of partial discharge using the sensor for detecting high frequency partial discharge of claim 4, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

17. A method of detecting an amount of partial discharge using the sensor for detecting high frequency partial discharge of claim 5, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

18. A method of detecting an amount of partial discharge using the sensor for detecting high frequency partial discharge of claim 6, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

19. A method of detecting an amount of partial discharge using the sensor for detecting high frequency partial discharge of claim 7, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

20. A method of detecting an amount of partial discharge using the sensor for detecting high frequency partial discharge of claim 8, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y=3.4877x+3.0437.$$

21. A method of detecting an amount of partial discharge using the sensor for detecting high frequency partial discharge of claim 9, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y = 3.4877x + 3.0437.$$

22. A method of detecting an amount of partial discharge using the sensor for detecting high frequency partial discharge of claim 10, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y = 3.4877x + 3.0437.$$

23. A method of detecting an amount of partial discharge using the sensor for detecting high frequency partial discharge of claim 11, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y = 3.4877x + 3.0437.$$

24. A method of detecting an amount of partial discharge using the sensor for detecting high frequency partial discharge of claim 12, comprising the steps of:

connecting the high frequency partial discharge detecting sensor between an inspection object and ground; and obtaining the amount of discharge x from an output voltage y output from a detecting unit of the high frequency partial discharge detecting sensor using the following equation:

$$y = 3.4877x + 3.0437.$$

* * * * *